US011387410B2

(12) United States Patent
Park et al.

(10) Patent No.: US 11,387,410 B2
(45) Date of Patent: Jul. 12, 2022

(54) SEMICONDUCTOR DEVICE INCLUDING DATA STORAGE MATERIAL PATTERN

(71) Applicant: SAMSUNG ELECTRONICS CO., LTD., Suwon-si (KR)

(72) Inventors: Jeonghee Park, Hwaseong-si (KR); Kwangmin Park, Seoul (KR); Jiho Park, Suwon-si (KR); Gyuhwan Oh, Hwaseong-si (KR); Jungmoo Lee, Hwaseong-si (KR); Hideki Horii, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 16/800,123

(22) Filed: Feb. 25, 2020

(65) Prior Publication Data
US 2020/0388758 A1 Dec. 10, 2020

(30) Foreign Application Priority Data
Jun. 7, 2019 (KR) .......................... 10-2019-0067441

(51) Int. Cl.
*H01L 27/24* (2006.01)
*H01L 45/00* (2006.01)

(52) U.S. Cl.
CPC .......... *H01L 45/1253* (2013.01); *H01L 27/24* (2013.01); *H01L 45/06* (2013.01); *H01L 45/141* (2013.01); *H01L 45/1675* (2013.01); *H01L 45/1683* (2013.01); *H01L 45/1691* (2013.01)

(58) Field of Classification Search
CPC .................................................. H01L 27/2427
See application file for complete search history.

(56) References Cited

U.S. PATENT DOCUMENTS

| | | | |
|---|---|---|---|
| 7,803,657 B2 | 9/2010 | Choi et al. | |
| 8,071,423 B2 | 12/2011 | Joo | |
| 8,816,314 B2 | 8/2014 | Gopalan | |
| 9,029,826 B2 | 5/2015 | Chang et al. | |
| 2013/0285000 A1 | 10/2013 | Arai | |
| 2015/0188050 A1 | 7/2015 | Kim et al. | |
| 2015/0325787 A1 | 11/2015 | Ahn et al. | |
| 2017/0244031 A1* | 8/2017 | Jeong | H01L 45/04 |
| 2017/0250222 A1* | 8/2017 | Wu | H01L 45/04 |
| 2018/0040809 A1* | 2/2018 | Moon | G06F 13/1673 |

* cited by examiner

*Primary Examiner* — Moazzam Hossain
*Assistant Examiner* — Hajar Kolahdouzan
(74) *Attorney, Agent, or Firm* — Sughrue Mion, PLLC

(57) ABSTRACT

A semiconductor device includes a base structure comprising a semiconductor substrate, a first conductive structure disposed on the base structure, and extending in a first direction, the first conductive structure including lower layers, and at least one among the lower layers including carbon, and a data storage pattern disposed on the first conductive structure. The semiconductor device further includes an intermediate conductive pattern disposed on the data storage pattern, and including intermediate layers, at least one among the intermediate layers including carbon, a switching pattern disposed on the intermediate conductive pattern, and a switching upper electrode pattern disposed on the switching pattern, and including carbon. The semiconductor device further includes a second conductive structure disposed on the switching upper electrode pattern, and extending in a second direction intersecting the first direction, and a hole spacer disposed on a side surface of the data storage pattern.

20 Claims, 24 Drawing Sheets

SEMICONDUCTOR DEVICE INCLUDING DATA STORAGE MATERIAL PATTERN

CROSS-REFERENCE TO THE RELATED APPLICATION

This application is based on and claims priority under 35 U.S.C. § 119 to Korean Patent Application No. 10-2019-0067441, filed on Jun. 7, 2019, in the Korean Intellectual Property Office, the disclosure of which is incorporated by reference herein in its entirety.

BACKGROUND

1. Field

The disclosure relates to a semiconductor device including a data storage material pattern.

2. Description of the Related Art

To achieve high performance and low power consumption in semiconductor devices such as memory devices and the like, next-generation memory devices such as phase-change random access memory (PRAM), resistive random-access memory RRAM and the like have been developed. Such next-generation memory devices may have resistance values changed according to current or voltage, and are formed using a data storage material capable of maintaining a resistance value, even when a current or voltage supply is interrupted.

SUMMARY

According to embodiments, a semiconductor device includes a base structure including a semiconductor substrate, a first conductive structure disposed on the base structure, and extending in a first direction, the first conductive structure including lower layers, and at least one among the lower layers including carbon, and a data storage pattern disposed on the first conductive structure. The semiconductor device further includes an intermediate conductive pattern disposed on the data storage pattern, and including intermediate layers, at least one among the intermediate layers including carbon, a switching pattern disposed on the intermediate conductive pattern, and a switching upper electrode pattern disposed on the switching pattern, and including carbon. The semiconductor device further includes a second conductive structure disposed on the switching upper electrode pattern, and extending in a second direction intersecting the first direction, and a hole spacer disposed on a side surface of the data storage pattern. The side surface of the data storage pattern is disposed on an entirety of a side surface of the hole spacer.

According to embodiments, a semiconductor device includes a base structure including a semiconductor substrate, a first conductive structure disposed on the base structure, and extending in a first direction, the first conductive structure including lower layers, and at least one among the lower layers including carbon, and a data storage pattern disposed on the first conductive structure. The semiconductor device further includes an intermediate conductive pattern disposed on the data storage pattern, and including intermediate layers, at least one among the intermediate layers including carbon, a switching pattern disposed on the intermediate conductive pattern, and a switching upper electrode pattern disposed on the switching pattern, and including carbon. The semiconductor device further includes a second conductive structure disposed on the switching upper electrode pattern, and extending in a second direction intersecting the first direction. A width of the at least one among the intermediate layers including carbon is greater than a width of the switching upper electrode pattern.

According to embodiments, a method of manufacturing a semiconductor device includes forming a base structure including a semiconductor substrate, forming a first conductive structure on the base structure, the first conductive structure extending in a first direction, the first conductive structure including lower layers, and at least one among the lower layers including carbon, and forming an interlayer insulating layer on the first conductive structure. The method further includes forming a hole through the interlayer insulating layer, forming a hole spacer on an internal wall of the hole, and forming a data storage pattern on the first conductive structure and the hole spacer by filling the hole with a data storage material. The method further includes forming an intermediate conductive pattern on the data storage pattern, the intermediate conductive pattern including intermediate layers, and at least one among the intermediate layers including carbon, forming a switching pattern on the intermediate conductive pattern, and forming a switching upper electrode pattern on the switching pattern. The method further includes forming a second conductive structure on the switching upper electrode pattern, the second conductive structure extending in a second direction intersecting the first direction.

DETAILED DESCRIPTION

Throughout this disclosure, directional terms such as "upper," "intermediate," "lower," and the like may be used herein to describe the relationship of one element or feature with another, and embodiments may not be limited by these terms. Accordingly, these terms such as "upper," "intermediate," "lower," and the like may be replaced by other terms such as "first," "second," "third," and the like to describe the elements and features.

Figure 1:
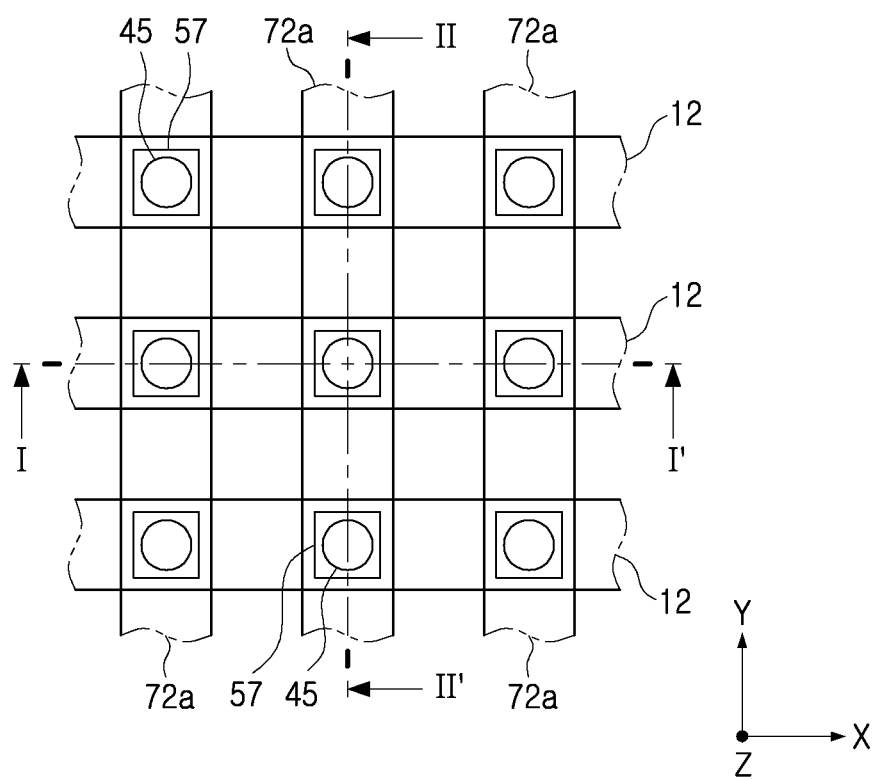
FIG. 1 is a plan view of a semiconductor device according to embodiments.
Figure 2:
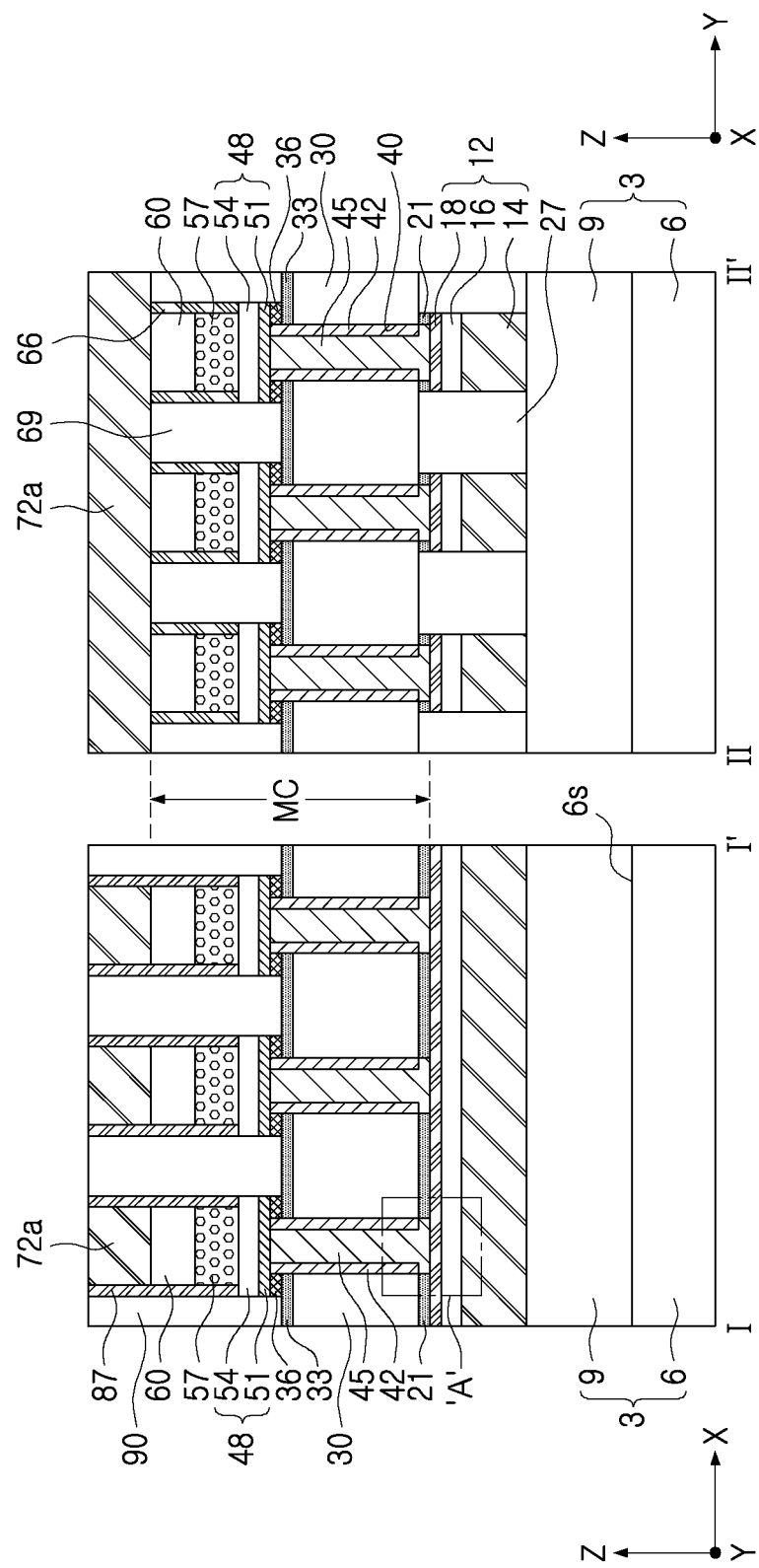
FIG. 2 illustrates cross-sectional views of the semiconductor device of FIG. 1, respectively along lines I-I' and II-II' in FIG. 1.

FIG. 1 is a plan view of a semiconductor device according to embodiments, and FIG. 2 illustrates cross-sectional views of the semiconductor device of FIG. 1, respectively along lines I-I' and II-II' in FIG. 1.

Referring to FIGS. 1 and 2, a first conductive structure 12 may be disposed on a base structure 3.

In an implementation, the base structure 3 may include a semiconductor substrate 6 and a circuit region 9 disposed on the semiconductor substrate 6. In an implementation, the semiconductor substrate 6 may be formed of a semiconductor material, e.g., silicon. The circuit region 9 may be a region in which a circuit for driving memory cells is disposed.

In an implementation, the first conductive structure 12 may include a plurality of layers 14, 16, and 18. The plurality of layers 14, 16, and 18 may be referred to as lower layers. For example, the first conductive structure 12 may include a first lower layer 14, a second lower layer 16 disposed on the first lower layer 14, and a third lower layer 18 disposed on the second lower layer 16. Any one or any combination of the plurality of layers 14, 16, and 18 may include carbon. For example, the second lower layer 16 may include a carbon material layer (e.g., a carbonaceous material) or a material layer including carbon. In an implementation, the material layer including carbon may be, e.g., a material layer including a metal element (such as tungsten (W) or the like) along with carbon (C). In an implementation, the material layer including carbon may include other metal elements, e.g., titanium (Ti), tantalum (Ta), ruthenium (Ru), or the like, other than W. In an implementation, the material layer including carbon may further include, e.g., nitrogen (N) or boron (B), other than carbon and the metal elements. In an implementation, the first lower layer 14 may be formed of a conductive material, e.g., tungsten. In an implementation, the third lower layer 18 may be formed of a conductive material including, e.g., W, TiN, TiAlN, TaN, WN, MoN, TiSiN, TiCN, TiBN, ZrSiN, WSiN, WBN, ZrAlN, MoAlN, TaSiN, TaAlN, TiON, TiAlON, WON, TaON, or combinations thereof. As used herein, the term "or" is not an exclusive term, e.g., "A or B" would include A, B, or A and B.

Side or lateral surfaces of the plurality of layers 14, 16, and 18 of the first conductive structure 12 may be aligned (e.g., coplanar, colinear, or otherwise continuous) with each other. A plurality of the first conductive structures 12 may be included in the semiconductor device. The first conductive structure 12 may be in the form of a line or linear structure extending in a first direction X. The first direction X may be parallel to an upper surface 6s of the semiconductor substrate 6.

A gap-fill insulating pattern 27 may be disposed on side surfaces of the first conductive structure 12. The gap-fill insulating pattern 27 may be formed of an insulating material, e.g., a silicon oxide.

A buffer layer 21 may be disposed on the first conductive structure 12. In an implementation, the buffer layer 21 may include either one or both of a metal oxide (e.g., AlO or the like) and a metal nitride (e.g., AN or the like). In an implementation, the buffer layer 21 may be formed of an insulating material, a semiconductor material, or a metallic material. Side surfaces of the buffer layer 21 may be aligned with side surfaces of the first conductive structure 12. The gap-fill insulating pattern 27 may extend to the side surfaces of the buffer layer 21 (e.g., may be disposed on the side surfaces of the buffer layer 21).

An interlayer insulating layer 30 may be disposed on the buffer layer 21 and the gap-fill insulating pattern 27. The interlayer insulating layer 30 may have a thickness (e.g., in a vertical direction Z that is perpendicular to the first direction X) greater than a thickness (in the vertical direction Z) of the buffer layer 21. The interlayer insulating layer 30 may be formed of an insulating material, e.g., SiO, SiN, SiCN, or SiON.

An etch-stop layer 33 may be disposed on the interlayer insulating layer 30. The etch-stop layer 33 may have a thickness (in the vertical direction Z) smaller than the thickness of the interlayer insulating layer 30. The etch-stop layer 33 may be formed of an insulating material, e.g., AlO or AlN.

In an implementation, a planarization-stop layer 36 may be disposed on the etch-stop layer 33. The planarization-stop layer 36 may be formed of an insulating material, e.g., a silicon nitride.

A hole 40 may penetrate through the planarization-stop layer 36, the etch-stop layer 33, the interlayer insulating layer 30, and the buffer layer 21, and may expose the first conductive structure 12.

A data storage material pattern 45 may be disposed in the hole 40. In an implementation, the data storage material pattern 45 may be formed of a chalcogenide phase change memory material capable of changing a phase from an amorphous phase having high resistivity to a crystalline phase having low resistivity or from the crystalline phase to the amorphous phase, according to temperature and time heated by an applied current. In an implementation, the data storage material pattern 45 may be formed of a phase change memory material such as a chalcogenide material including, e.g., germanium (Ge), antimony (Sb), and/or tellurium (Te). In an implementation, the data storage material pattern 45 may be formed of a phase change memory material including either one or both of Te and Se and any one or any combination of Ge, Sb, Bi, Pb, Sn, As, S, Si, P, 0, N, and In. In an implementation, the data storage material pattern 45 may be formed by replacing a phase change material with a data storage material capable of storing data in another manner. A height of the data storage material pattern 45 may be maintained constant throughout the semiconductor device, due to the buffer layer 21, the etch-stop layer 33 and the planarization-stop layer 36, thereby improving dispersion of the semiconductor device.

A hole spacer 42 may be interposed between the data storage material pattern 45 and the interlayer insulating layer 30. In an implementation, the hole spacer 42 may be interposed between the data storage material pattern 45 and the etch-stop layer 33 and interposed between the data storage material pattern 45 and the planarization-stop layer 36. The hole spacer 42 may be spaced apart from the first conductive structure 12. The hole spacer 42 may be formed of an insulating material, e.g., a silicon oxide or a silicon nitride. A side surface of the data storage material pattern 45 may be disposed on an entirety of a side surface of the hole spacer 42, and a bottom surface of the hole spacer 42 may be higher than a bottom surface of the data storage material pattern 42.

In an implementation, a width of the data storage material pattern 45 (in a second direction Y) may be smaller than a width of the first conductive structure 12 (in the second direction Y). The second direction Y may be parallel to the upper surface 6s of the semiconductor substrate 6. The second direction Y may be perpendicular to the first direction X.

In an implementation, the data storage material pattern 45 may include a portion extending in a direction parallel to the upper surface 6s of the semiconductor substrate 6 at a same level as the buffer layer 21 (e.g., a same distance from the substrate 6 in the vertical direction Z). For example, the data storage material pattern 45 may further include a portion extending between a lower surface of the hole spacer 42 and an upper surface of the first conductive structure 12.

An intermediate conductive pattern 48 may be disposed on the data storage material pattern 45. The intermediate conductive pattern 48 may include a plurality of layers 51 and 54. The plurality of layers 51 and 54 may be referred to as intermediate layers. For example, the intermediate conductive pattern 48 may include a first intermediate layer 51 and a second intermediate layer 54 disposed on the first intermediate layer 51. Either one or both of the plurality of layers 51 and 54 of the intermediate conductive pattern 48 may include carbon. In an implementation, the second intermediate layer 54 may include a carbon material layer or a material layer including carbon. The first intermediate layer 51 may be formed of a conductive material including, e.g., W, TiN, TiAlN, TaN, WN, MoN, TiSiN, TiCN, TiBN, ZrSiN, WSiN, WBN, ZrAlN, MoAlN, TaSiN, TaAlN, TiON, TiAlON, WON, TaON, or combinations thereof. Side surfaces of the plurality of layers 51 and 54 of the intermediate conductive pattern 48 may be aligned (e.g., self-aligned). The intermediate conductive pattern 48 may have a width (in the second direction Y) greater than a width (in the second direction Y) of the data storage material pattern 45.

In an implementation, the first intermediate layer 51 and the second lower layer 16, which may be formed of a carbon material layer or a material layer including carbon, may be spaced apart from the data storage material pattern 45.

A switching material pattern 57 may be disposed on the intermediate conductive pattern 48. A switching upper electrode pattern 60 may be disposed on the switching material pattern 57. The switching upper electrode pattern 60, the switching material pattern 57, and the intermediate conductive pattern 48 may constitute a switching device. For example, the switching upper electrode pattern 60, the switching material pattern 57, and the intermediate conductive pattern 48 may constitute an ovonic threshold switching (OTS) device. In an implementation, the switching material pattern 57 may be formed of a chalcogenide material different from the chalcogenide material of the data storage material pattern 45. In an implementation, the data storage material pattern 45 may be formed of a phase change memory material (e.g., an alloy of Ge, Sb, and/or Te) capable of changing a phase from a crystalline phase to an amorphous phase or from the amorphous phase to the crystalline phase, and the switching material pattern 57 may be formed of a chalcogenide OTS material capable of maintaining an amorphous phase during operation of the semiconductor device. In an implementation, the switching material pattern 57 may be formed of an alloy material including two or more of, e.g., As, S, Se, Te, or Ge, or an additional element (e.g., Si, N, or the like), capable of maintaining an amorphous phase at a higher temperature, in addition to the alloy material. In an implementation, the switching material pattern 57 may be formed of an alloy material among an alloy material including Te, As, Ge, and Si, an alloy material including Ge, Te, and Pb, an alloy material including Ge, Se, and Te, an alloy material including Al, As, and Te, an alloy material including Se, As, Ge, and Si, an alloy material including Se, As, Ge, and C, an alloy material including Se, Te, Ge, and Si, an alloy material including Ge, Sb, Te, and Se, an alloy material including Ge, Bi, Te, and Se, an alloy material including Ge, Bi, Te, and Se, an alloy material including Ge, As, Sb and Se, an alloy material including Ge, As, Bi, and Te, and an alloy material including Ge, As, Bi, and Se. The switching upper electrode pattern 60 may be formed of a carbon material or a material including carbon.

In an implementation, side surfaces of the switching material pattern 57 and the switching upper electrode pattern 60 may be aligned. For example, the switching material pattern 57 and the switching upper electrode pattern 60 may have substantially the same width (in the second direction Y).

In an implementation, in the second direction Y, a width of the intermediate conductive pattern 48 including carbon is greater than a width of the switching upper electrode pattern 60. Further, in the second direction Y and the region taken along line a width of the lower layers 14, 16 and 18 including carbon is less than the width of intermediate conductive pattern 48 including carbon, and is less than a width of the switching upper electrode pattern 60.

In an implementation, the switching material pattern 57 may have a width (in the second direction Y) greater than a width (in the second direction Y) of the data storage material pattern 45.

In an implementation, at least a portion of the intermediate conductive pattern 48 may have a width (in the second direction Y) greater than the width of the switching material pattern 57.

A second conductive structure 72a may be disposed on the switching upper electrode pattern 60. The second conductive structure 72a may include a single layer or a plurality of layers.

The second conductive structure 72a may be in the form of a line or linear structure extending in the second direction Y.

In an implementation, one of the first and second conductive structures 12 and 72a may be a wordline, and another one of the first and second conductive structures 12 and 72a may be a bitline.

A first gap-fill insulating pattern 69 may be interposed between the second conductive structure 72a and the interlayer insulating layer 30. The first gap-fill insulating pattern 69 may be disposed on side surfaces of the switching material pattern 57 (e.g., surfaces that face in the second direction Y). A second gap-fill insulating pattern 90 may be disposed on the interlayer insulating layer 30, on side surfaces of the switching material pattern 57 (e.g., surfaces facing in the first direction X) and on the side surfaces of the second conductive structure 72a (e.g., surfaces facing in the first direction X). The first and second gap-fill insulating patterns 69 and 90 may be formed of an insulating material, e.g., a silicon oxide.

Insulating spacers 66 and 87 may be disposed on the intermediate conductive pattern 48. The insulating spacers 66 and 87 may overlap (e.g., overlie) the intermediate conductive pattern 48 (e.g., such that a portion of the intermediate conductive pattern 48 is interposed between the insulating spacers 66 and 87 and the substrate 6 in the vertical direction Z), and may cover the side surfaces of the switching material pattern 57. The insulating spacers 66 and 87 may be formed of an insulating material, e.g., a silicon oxide or a silicon nitride.

In detail, the insulating spacers 66 and 87 may include a first spacer 66 and a second spacer 87. The first spacer 66 may be interposed between the intermediate conductive pattern 48 and the second conductive structure 72a. The first spacer 66 may extend from an upper surface of the intermediate conductive pattern 48 in the vertical direction Z to cover a side surface of the switching material pattern 57 (e.g., a surface facing in the second direction Y) and a side surface of the switching upper electrode pattern 60 (e.g., a surface facing in the second direction Y) and the side surface (e.g., surface facing in the second direction Y) of the switching upper electrode pattern 60. The vertical direction Z may be a direction perpendicular to the upper surface 6s of the semiconductor substrate 6. The first spacer 66 may be interposed between the side surface of the switching material pattern 57 and the first gap-fill insulating pattern 69 in the second direction Y and may be interposed between the side surface of the switching upper electrode pattern 60 and the first gap-fill insulating pattern 69 in the second direction Y.

The second spacer 87 may extend from the intermediate conductive pattern 48 in the vertical direction Z to cover the side surface of the switching material pattern 57 in the first direction X, the side surface of the pattern 60 in the first direction X, and the side surface of the second conductive structure 72a in the first direction X. For example, the second spacer 87 may be interposed between the side surface of the switching material pattern 57 and the second gap-fill insulating pattern 90 in the first direction X, may be interposed between the side surface of the switching upper electrode pattern 60 and the second gap-fill insulating pattern 90 in the first direction X and may be interposed between the side surface of the second conductive structure 72a and the second gap-fill insulating pattern 90 in the first direction X.

A memory cell structure MC may be interposed between the first conductive structure 12 (that extends in the first direction X) and the second conductive structure 72a (that extends in the second direction Y). The memory cell structure MC may include the data storage material pattern 45, the intermediate conductive pattern 48, the switching material pattern 57, and the switching upper electrode pattern 60, as described above.

In an implementation, the first conductive structure 12 below (e.g., closer to the substrate 6 in the vertical direction Z than) the data storage material pattern 45, and the intermediate conductive pattern 48 above (e.g., farther from the substrate 6 in the vertical direction Z than) the data storage material pattern 45, may include a carbon material layer or a material layer including carbon, as described above. In an implementation, the second lower layer 16 and the second intermediate layer 54 may include a carbon material layer or a material layer including carbon. As described above, the second lower layer 16, the second intermediate layer 54 and the switching upper electrode pattern 60, including a carbon material layer or a material layer including carbon, may act as a thermal barrier to significantly reduce loss of heat generated in the data storage material pattern 45 during operation of the memory cell structure MC. Thus, performance of the semiconductor device, including the memory cell structure MC, may be improved.

In an implementation, the hole spacer 42 in the hole 40 may decrease a width of the data storage material pattern 45. Thus, operating current of the semiconductor device, including the memory cell structure MC, may be reduced. Further, the hole spacer 42 prevents a formation of one or more seams in the data storage material pattern 45 during the formation of the data storage material pattern 45. Therefore, conductive or carbon material of the intermediate conductive pattern 51 does not fill such seams during the formation of the intermediate conductive pattern 51 and result in bridging between different portions of the data storage material pattern 45 and the intermediate conductive pattern 51.

In an implementation, the data storage material pattern 45 may include a portion extending between a lower surface of the hole spacer 42 and a top surface of the first conductive structure 12 (e.g., in the vertical direction Z) to increase a contact area between the data storage material pattern 45 and the first conductive structure 12. For example, the data storage material pattern 45 and the first conductive structure 12 may be brought into stable contact with each other to help prevent a poor contact between the data storage material pattern 45 and the first conductive structure 12, which could otherwise occur due to repeated phase change of the data storage material pattern 45 from a crystalline phase to an amorphous phase or from an amorphous phase to a crystalline phase, while operating the memory cell structure MC. Thus, durability and reliability of the semiconductor device may be improved.

Hereinafter, examples of the data storage material pattern 45 will be described with reference to FIGS. 3, 4, 5, and 6, respectively.

Figure 3:
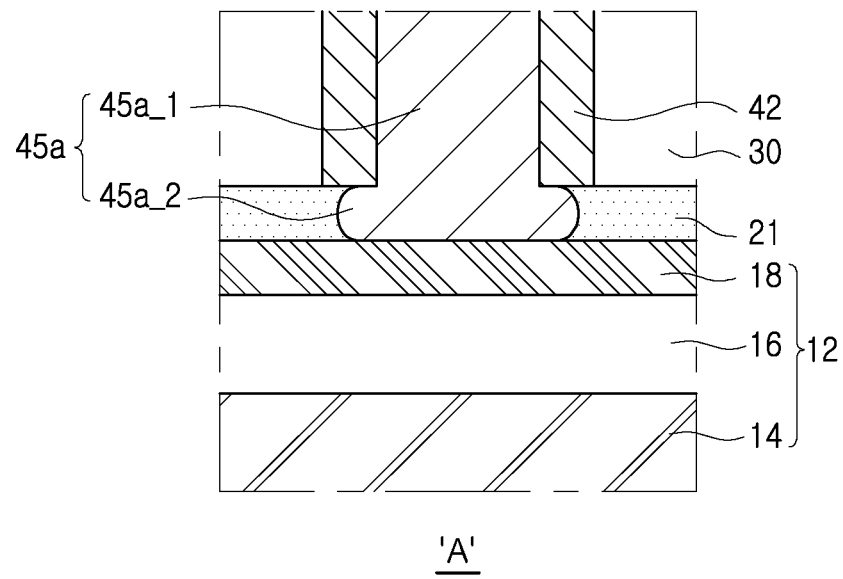
FIG. 3 is a partially enlarged view of the semiconductor device of FIG. 2 at a portion indicated by 'A' in FIG. 2.

FIG. 3 is a partially enlarged view of the semiconductor device of FIG. 2 at a portion indicated by 'A' in FIG. 2, and FIGS. 4, 5 and 6 are partially enlarged views of modified examples of the semiconductor device of FIG. 3.

In an implementation, referring to FIG. 3, a data storage material pattern 45a may include a first portion 45a_1 and a second portion 45a_2. The first portion 45a_1 of the data storage material pattern 45a may be defined (e.g., contained) by the hole spacer 42, and the second portion 45a_2 of the data storage material pattern 45a may be interposed between a lower surface of the hole spacer 42 and an upper surface of the first conductive structure 12 (e.g., in the vertical direction Z). The first portion 45a_1 of the data storage material pattern 45a may be at the same level as the interlayer insulating layer 30, and the second portion 45a_1 of the data storage material pattern 45a may be at the same level as the buffer layer 21. The second portion 45a_1 of the data storage material pattern 45a may extend (e.g., outwardly in the second direction Y) from a side surface of the first portion 45a_1 of the data storage material pattern 45a, by a distance less than a thickness (in the second direction Y) of the hole spacer 42.

Figure 4:
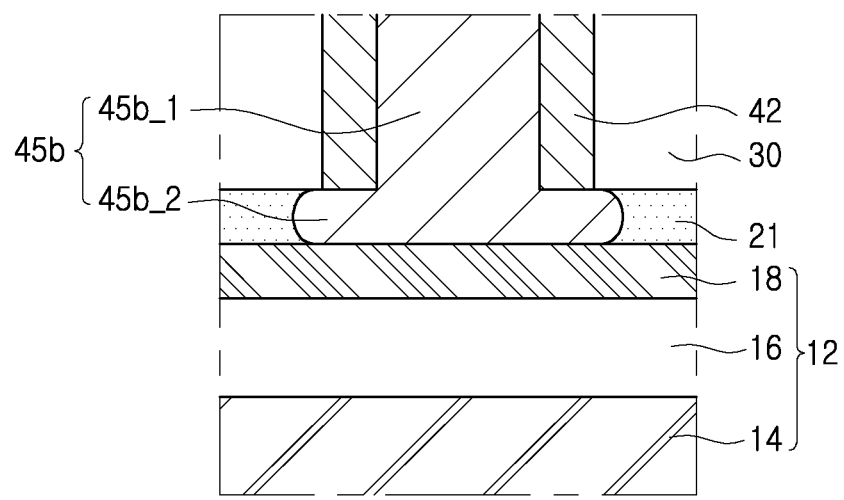
FIG. 4 is a partially enlarged view of a modified example of the semiconductor device of FIG. 3.

In an implementation, referring to FIG. 4, a data storage material pattern 45b may include a first portion 45b_1, at the same level as the interlayer insulating layer 30, and a second portion 45b_2, at the same level as the buffer layer 21. The second portion 45b_2 may extend (e.g., outwardly in the second direction Y) from a side surface of the first portion 45b_1 of the data storage material pattern 45b, by a distance greater than the thickness (in the second direction Y) of the hole spacer 42. For example, the second portion 45b_2 of the data storage material pattern 45b may be interposed between the lower surface of the hole spacer 42 and the upper surface of the first conductive structure 12 (in the vertical direction Z) and may also be interposed between a lower surface of the interlayer insulating layer 30 and the upper surface of the first conductive structure 12 (in the vertical direction Z).

Figure 5:
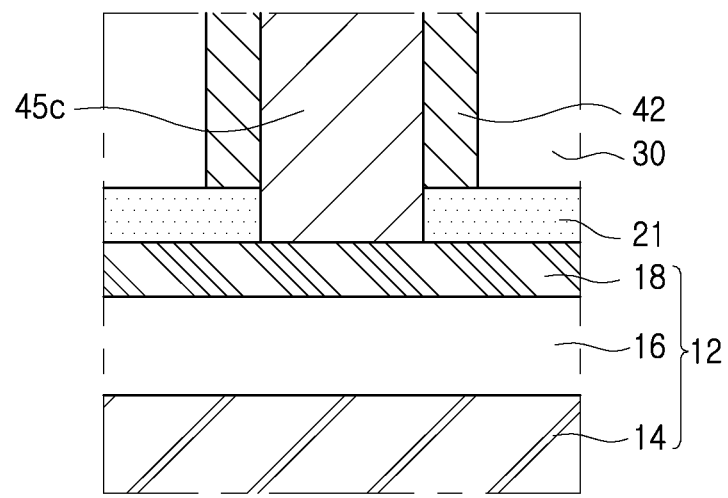
FIG. 5 is a partially enlarged view of a modified example of the semiconductor device of FIG. 3.

In an implementation, referring to FIG. 5, a data storage material pattern 45c may extend downwardly to be in contact with the upper surface of the first conductive structure 12. For example, a first portion of the data storage material pattern 45c at the same level as the interlayer insulating layer 30 may have a width (in the second direction Y) that is the same as a second portion of the data storage material pattern 45c extending downwardly (e.g., toward the substrate 6) from the first portion of the data storage material pattern 45c at the same level as the interlayer insulating layer 30.

Figure 6:
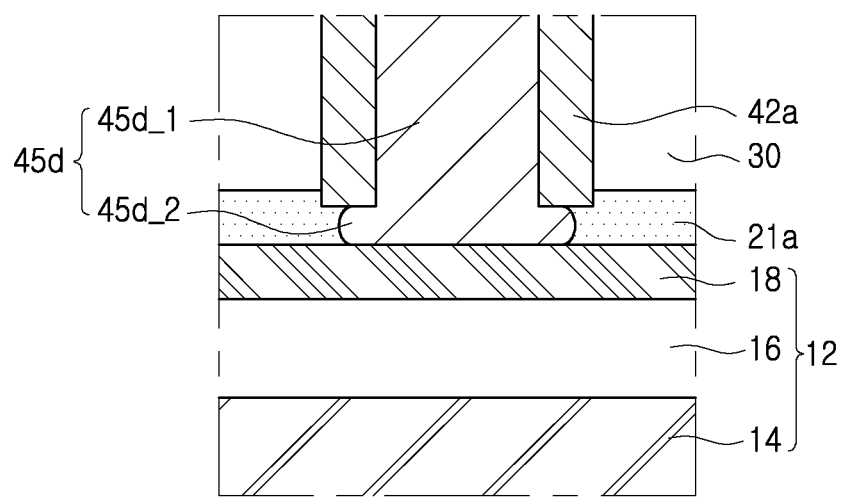
FIG. 6 is a partially enlarged view of a modified example of the semiconductor device of FIG. 3.

In an implementation, referring to FIG. 6, a data storage material pattern 45d may include a first portion 45d_1, and a second portion 45d_2 below the first portion 45d_1 and having a width greater than a width of the first portion 45d_1. The first portion 45d_1 of the data storage material pattern 45d may include a portion at the same level as the interlayer insulating layer 30 and a portion at the same level as a portion of the buffer layer 21a. The second portion 45d_2 of the data storage material pattern 45d may be interposed between the lower surface of the hole spacer 42a and the upper surface of the first conductive structure 12 (e.g., in the vertical direction Z). A thickness of the second portion 45d_2 of the data storage material pattern 45d in the vertical direction Z may be smaller than a thickness of a portion of the buffer layer 21a between the interlayer insulating layer 30 and the first conductive structure 12, in the vertical direction Z. In the buffer layer 21a, a portion between the hole spacer 42a and the first conductive structure 12 (e.g., in the vertical direction Z) may have a thickness less than a thickness of a portion thereof between the interlayer insulating layer 30 and the first conductive structure 12. That is, the hole spacer 42a may be disposed into a top surface of the buffer layer 21a so that a bottom surface of the hole spacer 42a may be lower than the top surface of the buffer layer 21a.

FIGS. 7, 8, 9, and 10 are cross-sectional views of modified examples of the semiconductor device of FIG. 2. When the modified examples of the semiconductor device according to embodiments are respectively described with reference to FIGS. 7, 8, 9, and 10, only modified parts of the semiconductor device according to embodiments will be described. Therefore, even if there no additional description, the other parts can be understood from the contents described with reference to FIG. 2.

Figure 7:
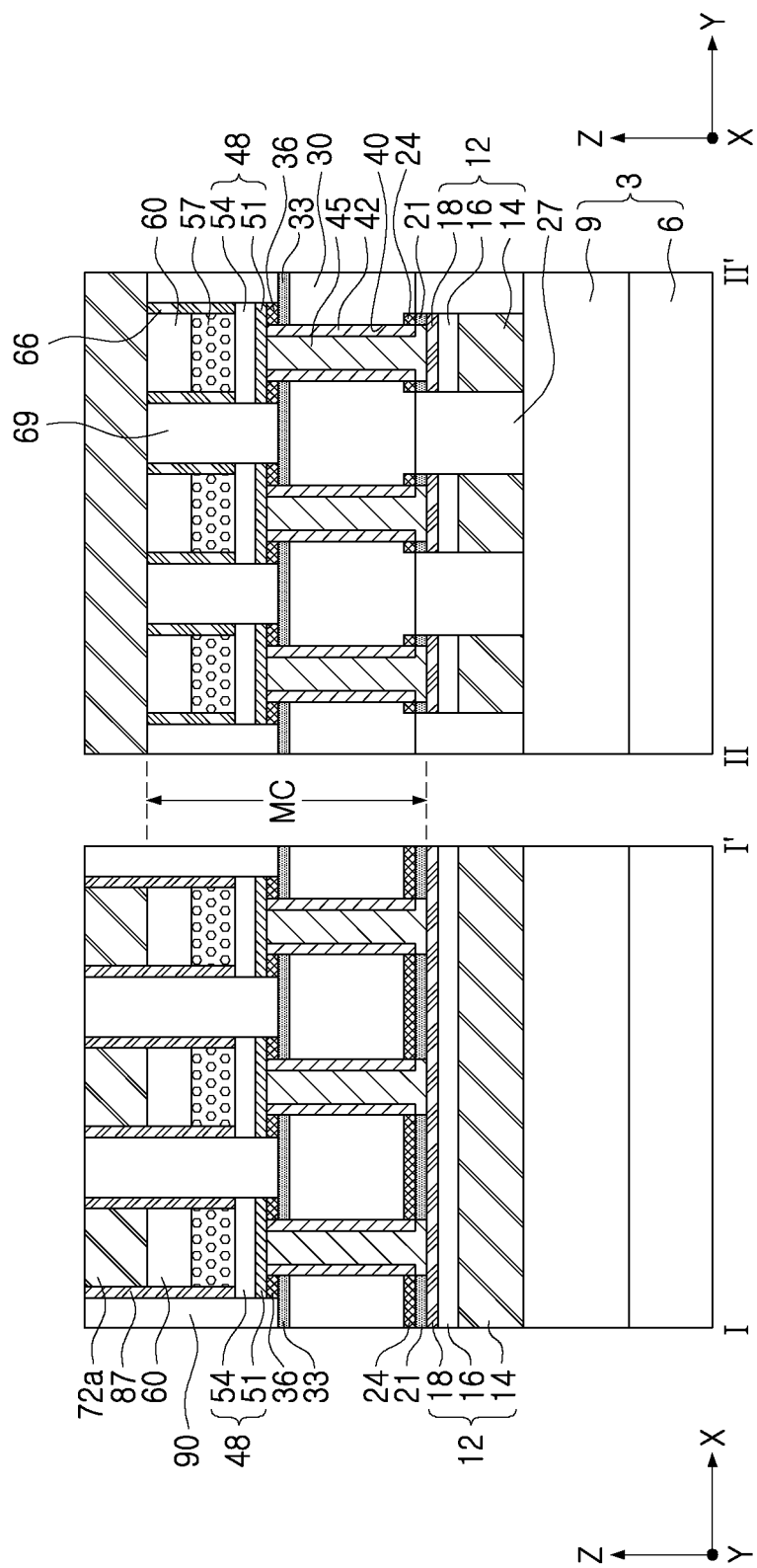
FIG. 7 is a cross-sectional view of a modified example of the semiconductor device of FIG. 2.

In an implementation, referring to FIG. 7, a (e.g., lower) planarization-stop layer 24 may be interposed between the buffer layer 21 and the interlayer insulating layer 30. The planarization-stop layer 24 may be formed of an insulating material, e.g., a silicon nitride. A side surface of the planarization-stop layer 24, a side surface of the buffer layer 21, and a side surface of the first conductive structure 12 may be aligned.

Figure 8:
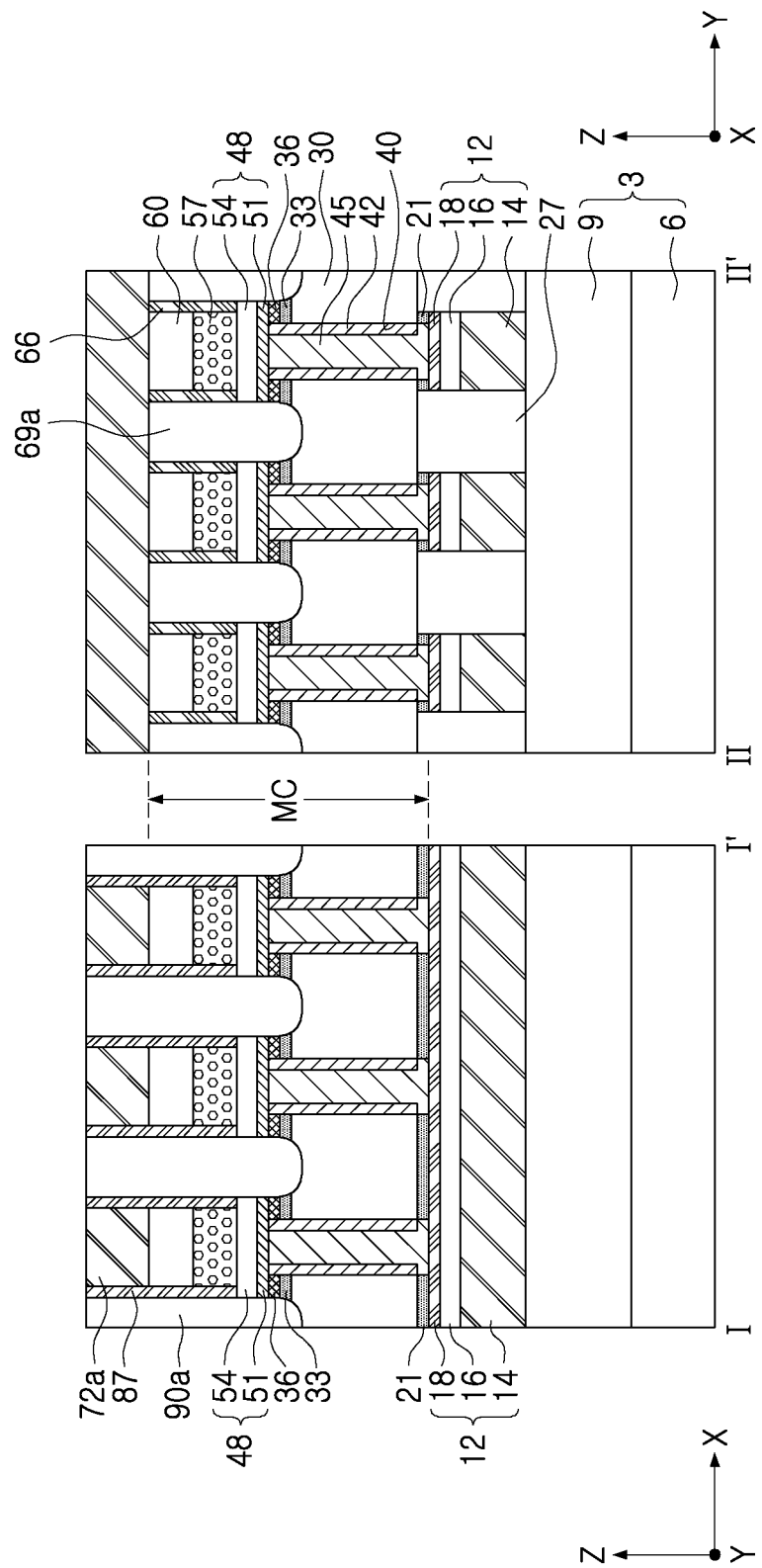
FIG. 8 is a cross-sectional view of a modified example of the semiconductor device of FIG. 2.

In an implementation, referring to FIG. 8, a first gap-fill insulating pattern 69a and a second gap-fill insulating layer 90a may extend downwardly (e.g., in the vertical direction Z) from a portion thereof that covers (e.g., is at a same level as) the side surface of the intermediate conductive pattern 48, to sequentially penetrate through the planarization-stop layer 36 and the etch-stop layer 33 to be in contact with the interlayer insulating layer 30.

Figure 9:
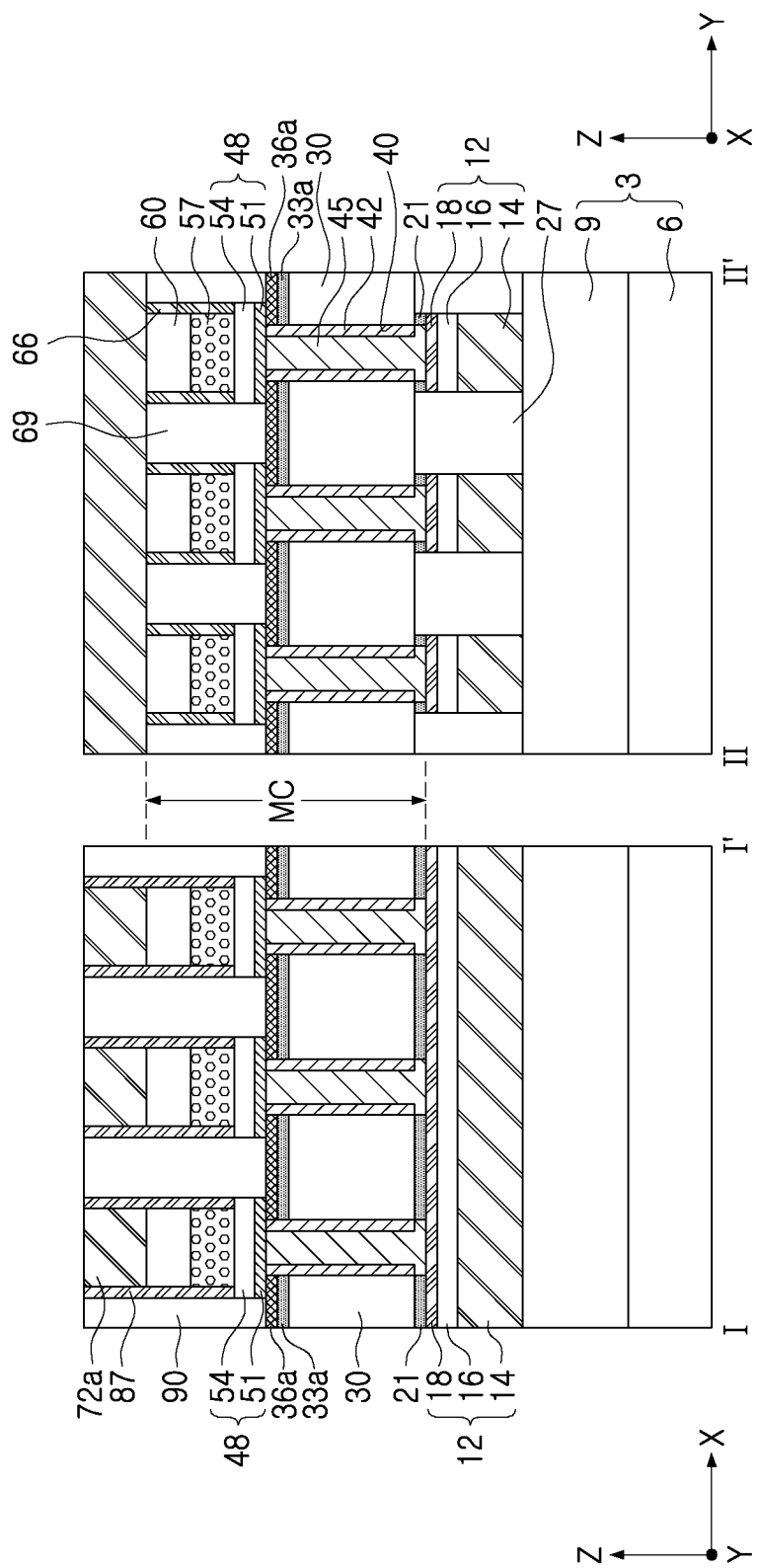
FIG. 9 is a cross-sectional view of a modified example of the semiconductor device of FIG. 2.

In an implementation, referring to FIG. 9, an etch-stop layer 33a and a planarization-stop layer 36a, sequentially stacked, may extend outwardly from being between the interlayer insulating layer 30 and the intermediate conductive pattern 48 to being between the interlayer insulating layer 30 and the second gap-fill insulating pattern 90 and between the interlayer insulating layer 30 and the first gap-fill insulating pattern 69.

Figure 10:
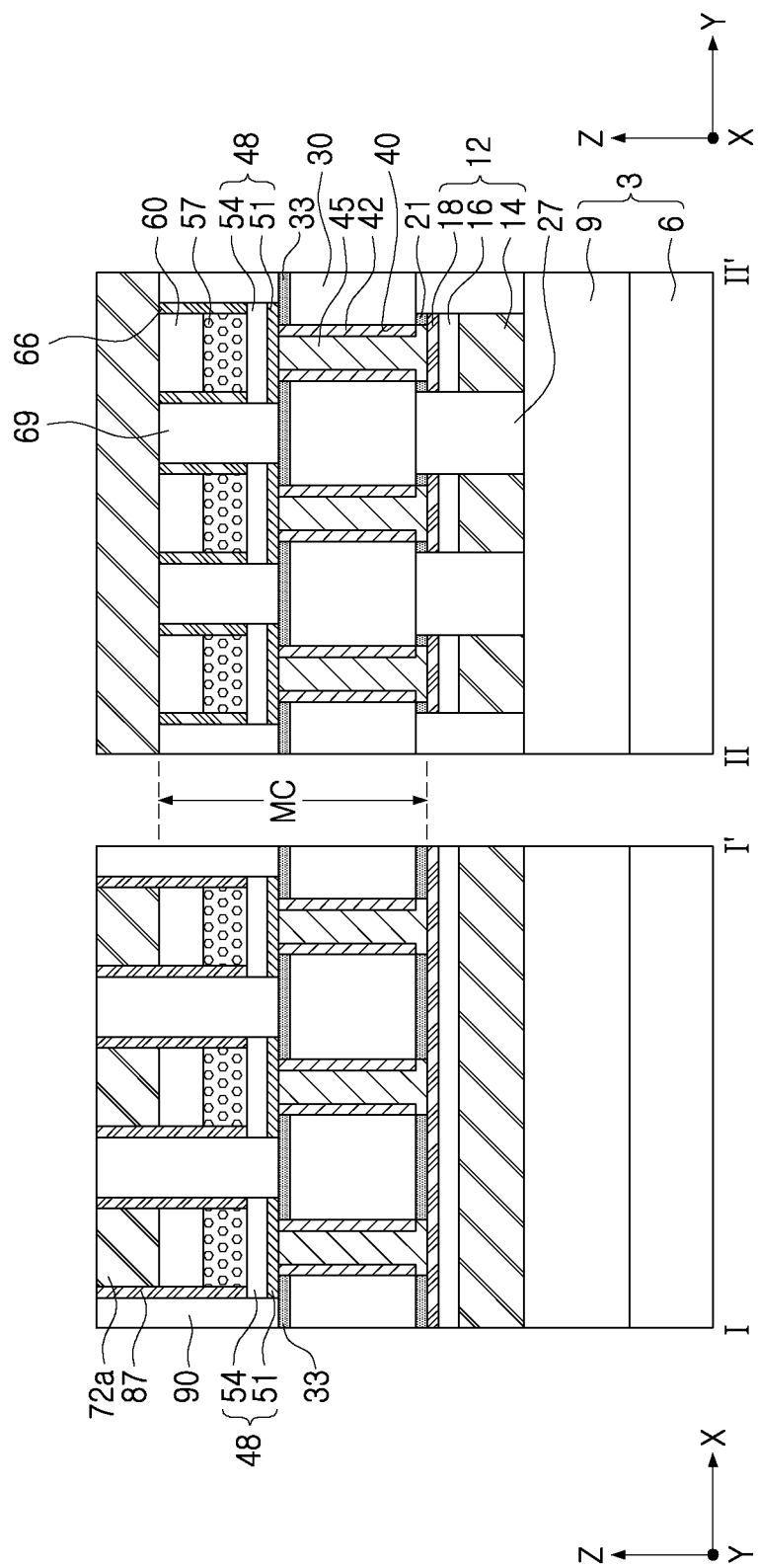
FIG. 10 is a cross-sectional view of a modified example of the semiconductor device of FIG. 2.

In an implementation, referring to FIG. 10, the planarization-stop layer (36 of FIG. 2) may be omitted. For example, the etch-stop layer 33 and the intermediate conductive pattern 48 may be in contact (e.g., direct contact) with each other.

Hereinafter, an example, in which a plurality of memory cell structures MC described in the above embodiments are stacked in the vertical direction Z, will be described with reference to FIGS. 11A and 11B.

Figure 11A:
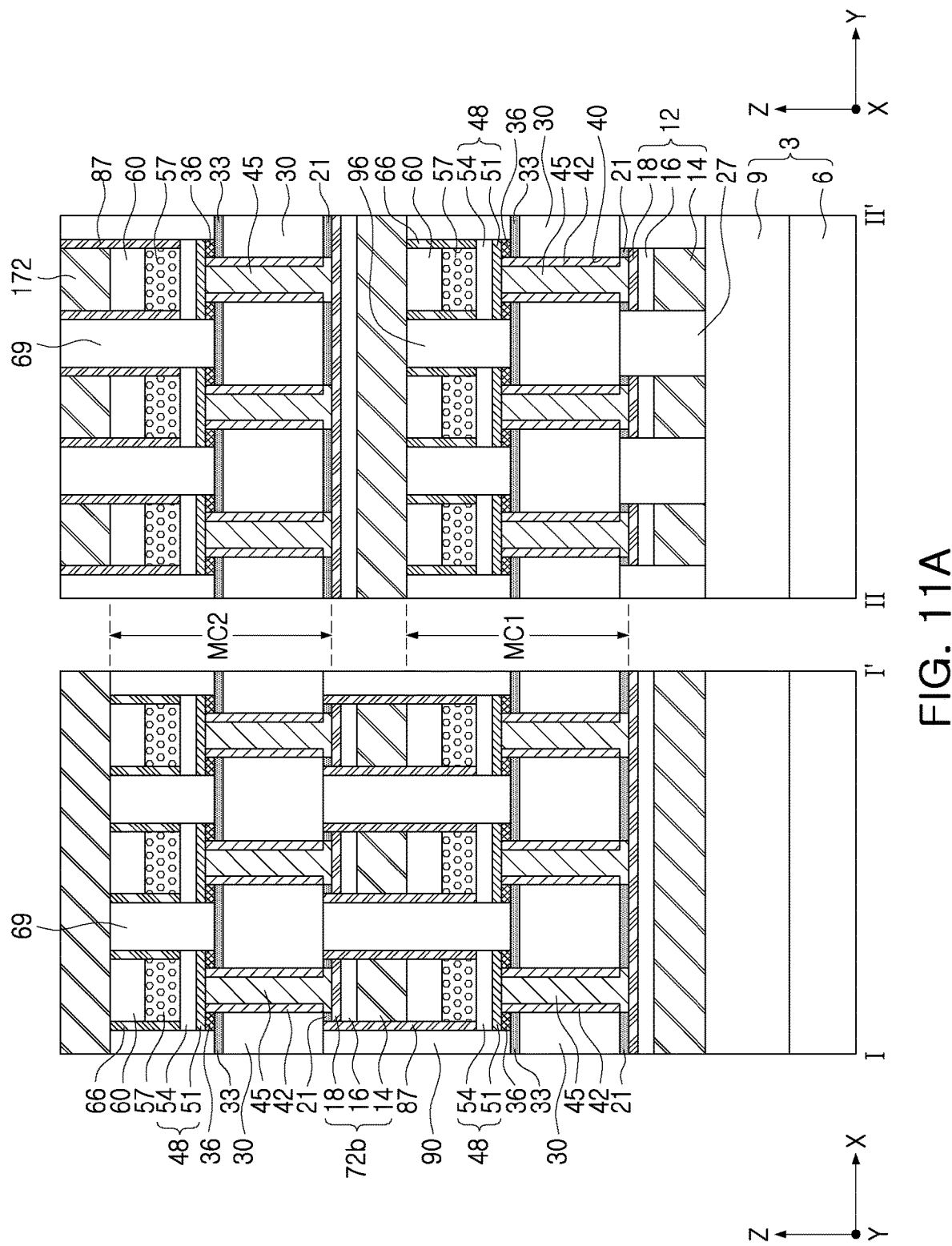
FIG. 11A is a cross-sectional view of a modified example of a semiconductor device according to embodiments.
Figure 11B:
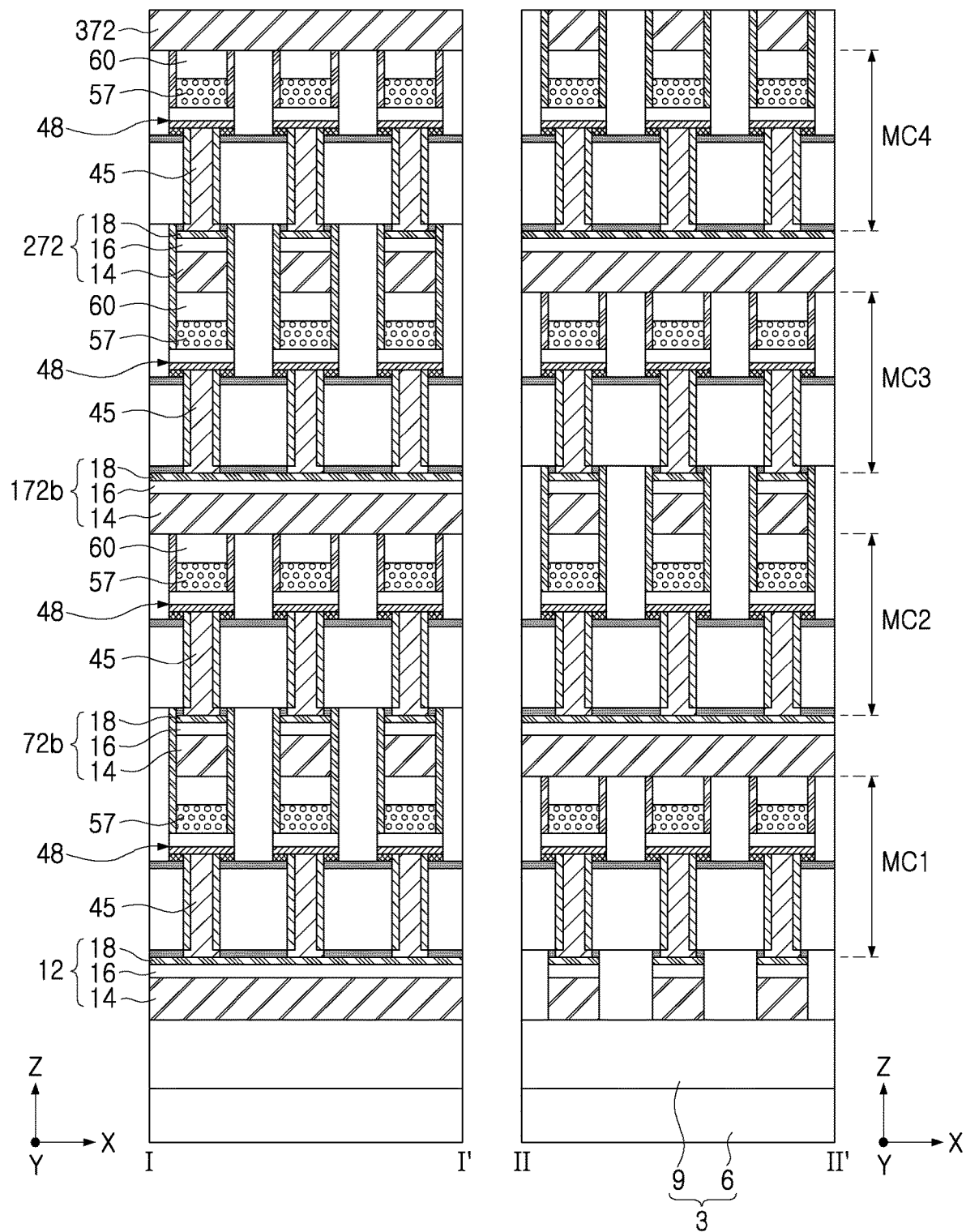
FIG. 11B is a cross-sectional view of a modified example of a semiconductor device according to embodiments.

FIGS. 11A and 11B are cross-sectional views of modified examples of a semiconductor device according to embodiments. When describing an example in which a plurality of memory cell structures MC are stacked, descriptions of components overlapping with the above-described components will be omitted and descriptions will focus on transformed or added components.

Hereinafter, an example, in which the above-described memory cell structure MC is stacked in two stages in the vertical direction Z, will be described with reference to FIG. 11A.

Referring to FIG. 11A, a first conductive structure 12 extending in the first direction X, a second conductive structure 72b, on the first conductive structure 12 and extending in the second direction Y, and a third conductive structure 172, on the second conductive structure 72b and extending in the first direction X, may be disposed on a base structure 3 that is the same as described with reference to FIG. 2. For example, a first memory cell structure MC1 may be interposed between the first conductive structure 12 and the second conductive structure 72b, and a second memory cell structure MC2 may be interposed between the second conductive structure 72b and the third conductive structure 172.

Among the first to third conductive structures 12, 72b, and 172, a conductive structure at a relatively lower portion (e.g., closer to the substrate 6 in the vertical direction Z), may have the same structure as the first conductive structure 12 described with reference to FIG. 2. For example, each of the first and second conductive structures 12 and 72b may include the plurality of layers 14, 16 and 18 described with reference to FIG. 2.

The second memory cell structure MC2 may have a structure in which the first memory cell structure MC1 is rotated 90 degrees in plan view. For example, in FIG. 11A, the second memory cell structure MC2 in the region indicated by line I-I' is substantially the same as the first memory cell structure MC1 in the region indicated by line II-II'. The second memory cell structure MC2 in the region indicated by line II-II' may be substantially the same as the first memory cell structure MC1 in the region indicated by line I-I'.

Hereinafter, an example, in which the above-described memory cell structure MC is stacked in three or more stages in the vertical direction Z, will be described with reference to FIG. 11B. As an example, an example, in which the above-described memory cell structure MC is stacked in four stages in the vertical direction Z, will be described.

Referring to FIG. 11B, a third memory cell structure MC3 and a fourth memory cell structure MC4 may be sequentially stacked on the first memory cell structure MC1 and the second memory cell structure MC2, as described with reference to FIG. 11A.

The first memory cell structure MC1 may be interposed between the first conductive structure 12 and the second conductive structure 72b, as described above. The second memory cell structure MC2 may be interposed between the second conductive structure 72b and a third conductive structure 172b. The third memory cell structure MC3 may be interposed between the third conductive structure 172b and the fourth conductive structure 272. The fourth memory cell structure MC4 may be interposed between the fourth conductive structure 272 and the fifth conductive structure 372.

Among the first to fifth conductive structures 12, 72b, 172b, 272 and 372, each of the first to fourth conductive structures 12, 72b, 172b, and 272, at a relatively lower position, may include the plurality of layers 14, 16 and 18, described with reference to FIG. 2.

The first, third, and fifth conductive structures 12, 172b, and 372 may extend in the first direction X, and the second and fourth conductive structures 72b and 272 may extend in the second direction Y. The first memory cell structure MC1 and the third memory cell structure MC3 may have the same structure, and the second memory cell structure MC2 and the fourth memory cell structure MC4 may have the same structure.

Figure 12:
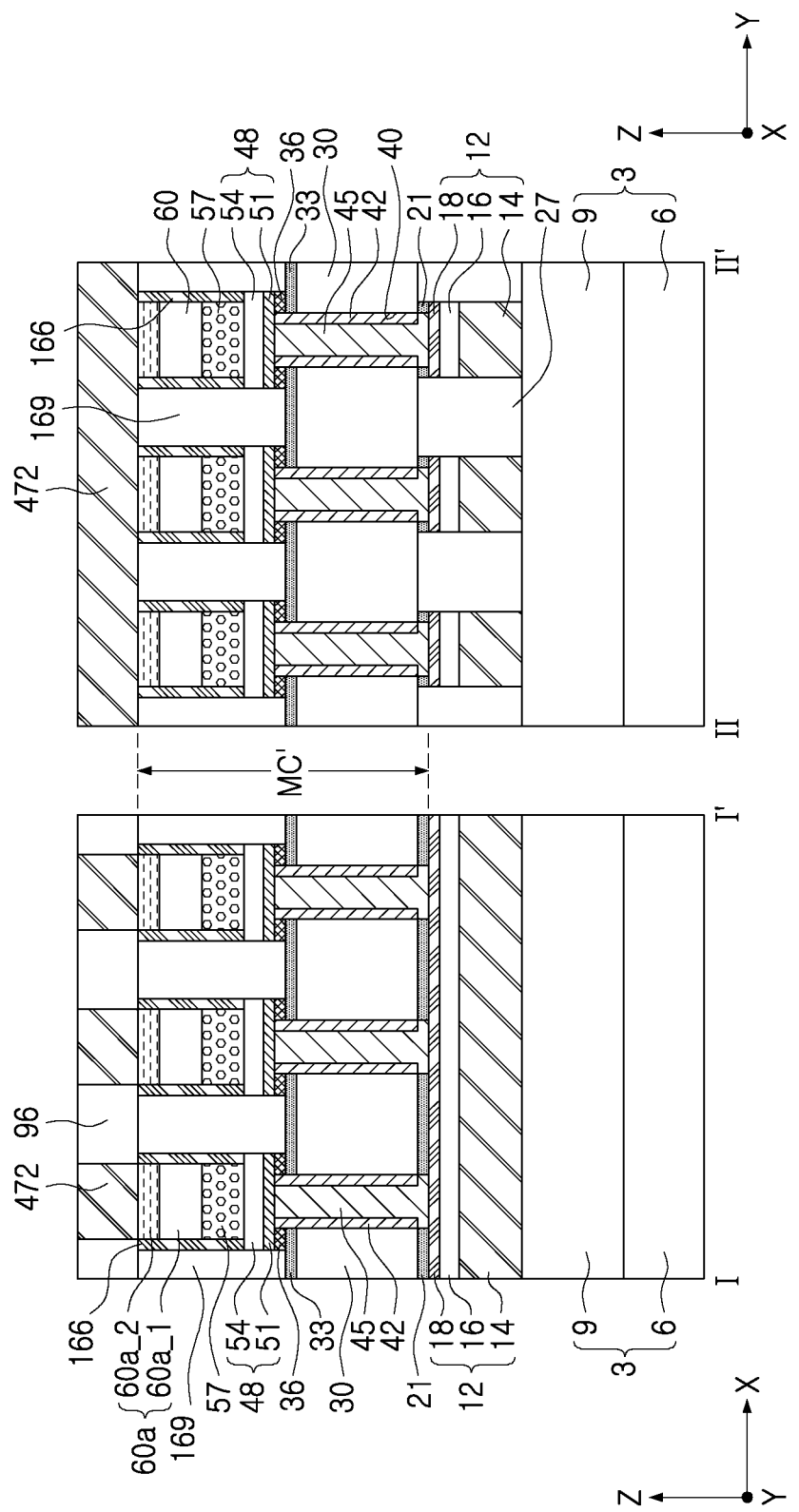
FIG. 12 is a cross-sectional view of a modified example of a semiconductor device according to embodiments.

FIG. 12 is a cross-sectional view of a modified example of a semiconductor device according to embodiments.

In an implementation, referring to FIG. 12, the base structure 3, the buffer layer 21, the interlayer insulating layer 30, the etch-stop layer 33, the planarization-stop layer 36, the data storage material pattern 45, the hole spacer 42, the intermediate conductive pattern 48, and the switching material pattern 57 may be provided, as described with reference to FIG. 2.

A switching upper electrode pattern 60a may be disposed on the switching material pattern 57. The switching upper electrode pattern 60a may include a plurality of layers stacked sequentially. For example, the switching upper electrode pattern 60a may include a first upper electrode layer 60a_1 and a second upper electrode layer 60a_2 disposed on the first upper electrode layer 60a_1. In an implementation, the first upper electrode layer 60a_1 may be a carbon material layer or a material layer including carbon. The second upper electrode layer 60a_2 may include a conductive material layer of, e.g., tungsten.

A side surface of the switching material pattern 57 and a side surface of the switching upper electrode pattern 60a may be aligned. For example, the switching material pattern 57 and the switching upper electrode pattern 60a may have substantially the same width.

Spacers 166 may cover sidewalls of the sequentially stacked switching material pattern 57 and switching upper electrode pattern 60a. The spacers 166 may be disposed on the intermediate conductive pattern 48. The spacers 166 may be formed of an insulating material, e.g., a silicon oxide or a silicon nitride.

A gap-fill insulating pattern 169 may be disposed on the interlayer insulating layer 30 and may cover a side surface of the intermediate conductive pattern 48 while extending upwardly (e.g., in the vertical direction Z). The spacer 166 may be interposed between sidewalls of the switching material pattern 57 and the switching upper electrode pattern 60a and the gap-fill insulating pattern 169.

A second conductive structure 472 may be disposed on the switching upper electrode pattern 60a and may extend in the second direction Y. An upper gap-fill insulating pattern 93 may cover the side surface of the second conductive structure 472.

A memory cell structure MC' may be interposed between the first conductive structure 12 and the second conductive structure 472. The memory cell structure MC' may include the data storage material pattern 45, the intermediate conductive pattern 48, the switching material pattern 57, and the switching upper electrode pattern 60a, which are the same as described above.

Hereinafter, an example, in which the memory cell structure MC' is stacked in the vertical direction Z, will be described with reference to FIG. 13.

Figure 13:
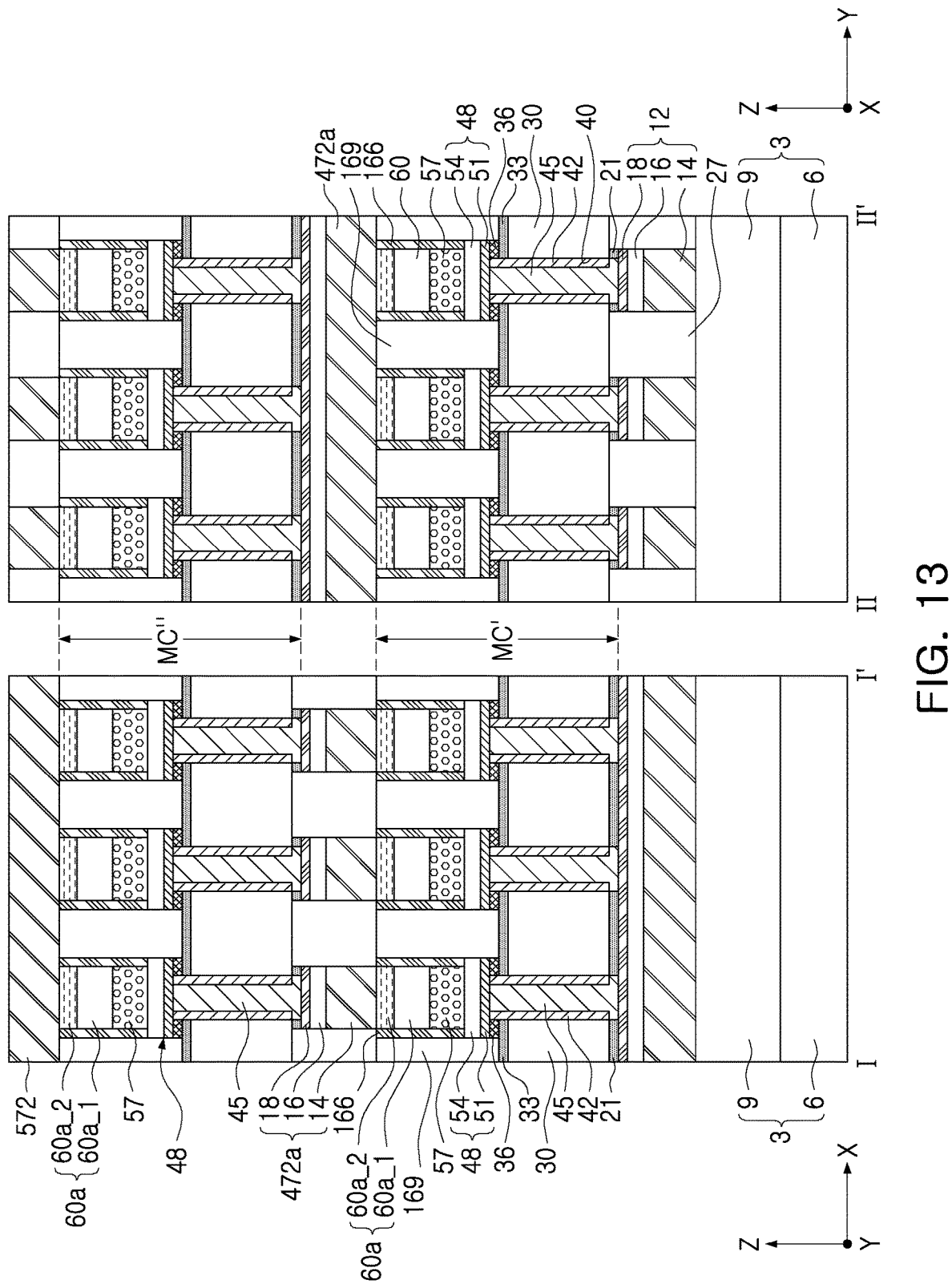
FIG. 13 is a cross-sectional view of a modified example of a semiconductor device according to embodiments.

FIG. 13 is a cross-sectional view of a modified example of a semiconductor device according to embodiments.

Referring to FIG. 13, a first conductive structure 12 extending in the first direction X, a second conductive structure 472a, on the second conductive structure 472a and extending in the second direction Y, and a third conductive structure 572, on the second conductive structure 472a and extending in the first direction X, may be disposed on a base structure that is the same as described with reference to FIG. 12. For example, a first memory cell structure MC', which is the same as described with reference to FIG. 12, may be interposed between the first conductive structure 12 and the second conductive structure 472a, and a second memory cell structure MC" may be interposed between the second conductive structure 472a and the third conductive structure 572.

Among the first to third conductive structures 12, 472a, and 572, a conductive structure at a relatively lower position (e.g., closer to the substrate 6 in the vertical direction Z) may have the same structure as the first conductive structure 12 described with reference to FIG. 2. For example, each of the first and second conductive structures 12 and 472a may include the plurality of layers 14, 16, and 18 described with reference to FIG. 2. The second memory cell structure MC" may have a structure in which the first memory cell structure MC' is rotated 90 degrees in a plan view in the same manner as described with reference to FIG. 11A. For example, a plurality of memory cell structures MC' and MC", stacked in a vertical direction Z, may be provided.

Hereinafter, a method of fabricating a semiconductor device according to embodiments will be described with reference to FIG. 1 and FIGS. 14 to 25.

FIGS. 14, 15, 16, 17, 18, 19, 20, 21, 22, 23, 24 and 25 are cross-sectional views of stages in a method of fabricating a semiconductor device according to embodiments. In detail, FIGS. 14 to 25 are cross-sectional views illustrating regions taken along line I-I' of FIG. 1 and regions taken along line II-II' of FIG. 1.

Figure 14:
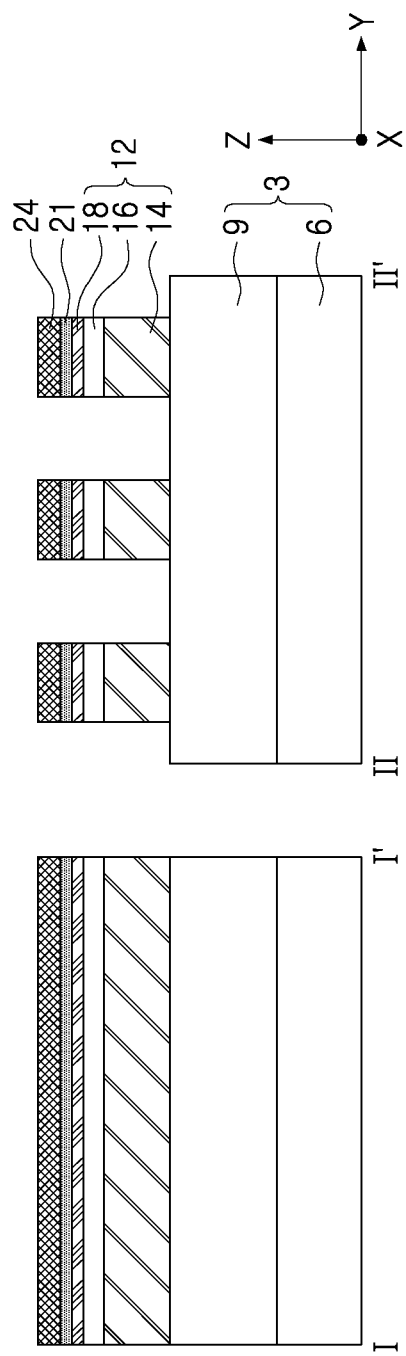
FIGS. 14, 15, 16, 17, 18, 19, 20, 21, 22, 23, 24 and 25 are cross-sectional views of stages in a method of fabricating a semiconductor device according to embodiments.

Referring to FIGS. 1 and 14, structure 12, 21, and 24 having a line shape or linear structure may be formed on a base structure 3. The base structure 3 may include a semiconductor substrate 6 and a lower circuit region 9 on the semiconductor substrate 6. The lower circuit region 9 may be a peripheral circuit region.

The structure 12, 21, and 24 may include a first conductive structure 12, a buffer layer 21, and a planarization-stop layer 24 stacked sequentially.

In an implementation, the first conductive structure 12 may include a plurality of layers 14, 16, and 18 stacked sequentially. For example, the first conductive structure 12 may include a first lower layer 14, a second lower layer 16, and a third lower layer 18 stacked sequentially.

In an implementation, the buffer layer 21 may be formed of, e.g., a metal oxide such as AlO or the like, or a metal nitride such as AlN or the like, or a material capable of replacing or functioning as the same.

The planarization-stop layer 24 may be formed of, e.g., an insulating material such as a silicon nitride.

Figure 15:
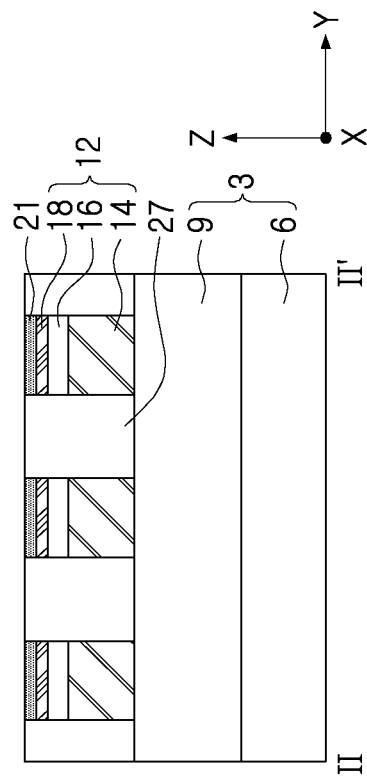

Referring to FIGS. 1 and 15, in the region taken along line a gap-fill layer may be deposited and planarized until exposure of the planarization stop-layer (24 of FIG. 14) to form a gap-fill insulating pattern 27.

In an implementation, the planarization-stop layer (24 of FIG. 14) may be completely removed to expose the buffer layer 21.

In an implementation, the planarization-stop layer (24 of FIG. 14) may remain with a reduced thickness thereof.

Figure 16:
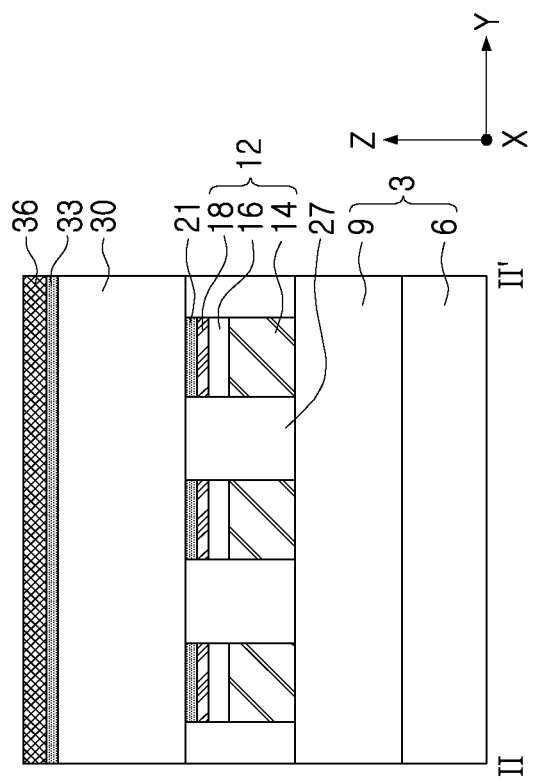

Referring to FIGS. 1 and 16, an interlayer insulating layer 30, an etch-stop layer 33, and a planarization-stop layer 36 may be sequentially formed on the buffer layer 21 and the gap-fill insulating pattern 27. The interlayer insulating layer 30 may be formed of, e.g., an insulating material such as SiO, SiN, SiCN, or SiON. The etch-stop layer 33 may be formed of, e.g., an insulating material such as AlO or AlN. The planarization-stop layer 36 may be formed of, e.g., an insulating material such as a silicon nitride.

Figure 17:
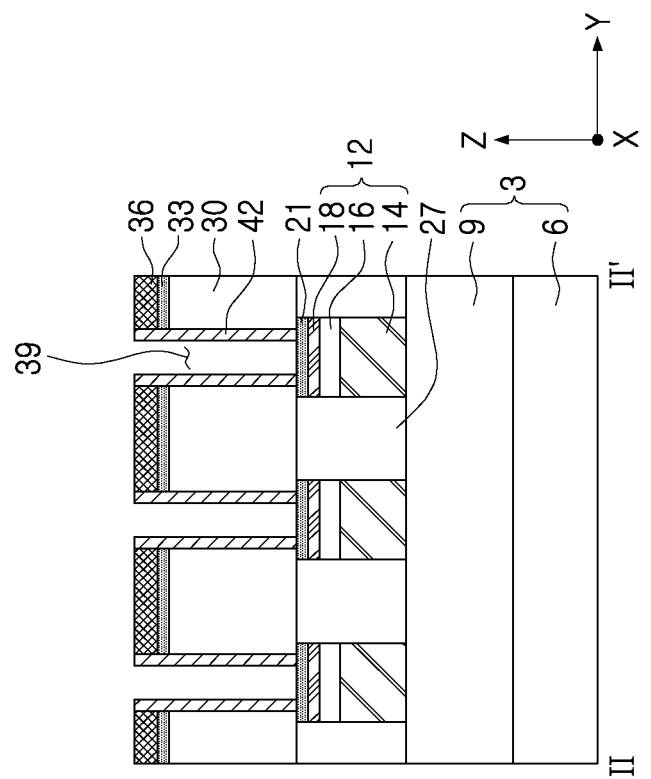
Figure 17:
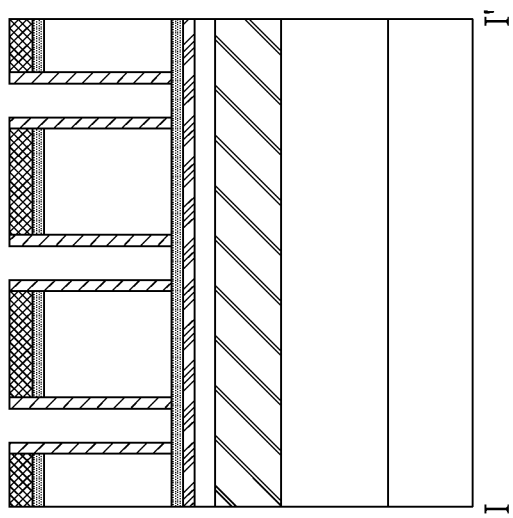

Referring to FIGS. 1 and 17, a preliminary hole 39 may be formed to sequentially penetrate through the planarization-stop layer 36, the etch-stop layer 33, and the interlayer insulating layer 30. A plurality of preliminary holes 39 may be formed.

In an implementation, the preliminary hole 39 may overlap the buffer layer 21.

The buffer layer 21 may help protect the first conductive structure 12 from an etching process in which the interlayer insulating layer 30 is etched to form the preliminary hole 39.

A hole spacer 42 may be formed on a sidewall of the preliminary hole 39. Forming the hole spacer 42 may include forming a spacer layer to cover an internal wall of the preliminary hole 39 and an upper surface of the planarization-stop layer 36 and anisotropically etching the spacer layer. The buffer layer 21 may protect the first conductive structure 12 from an etching process in which the spacer layer is anisotropically etched to form the hole spacer 42. The preliminary hole 39 may be defined by the hole spacer 42. Thus, the hole spacer 42 may decrease a width of the preliminary hole 39.

Figure 18:
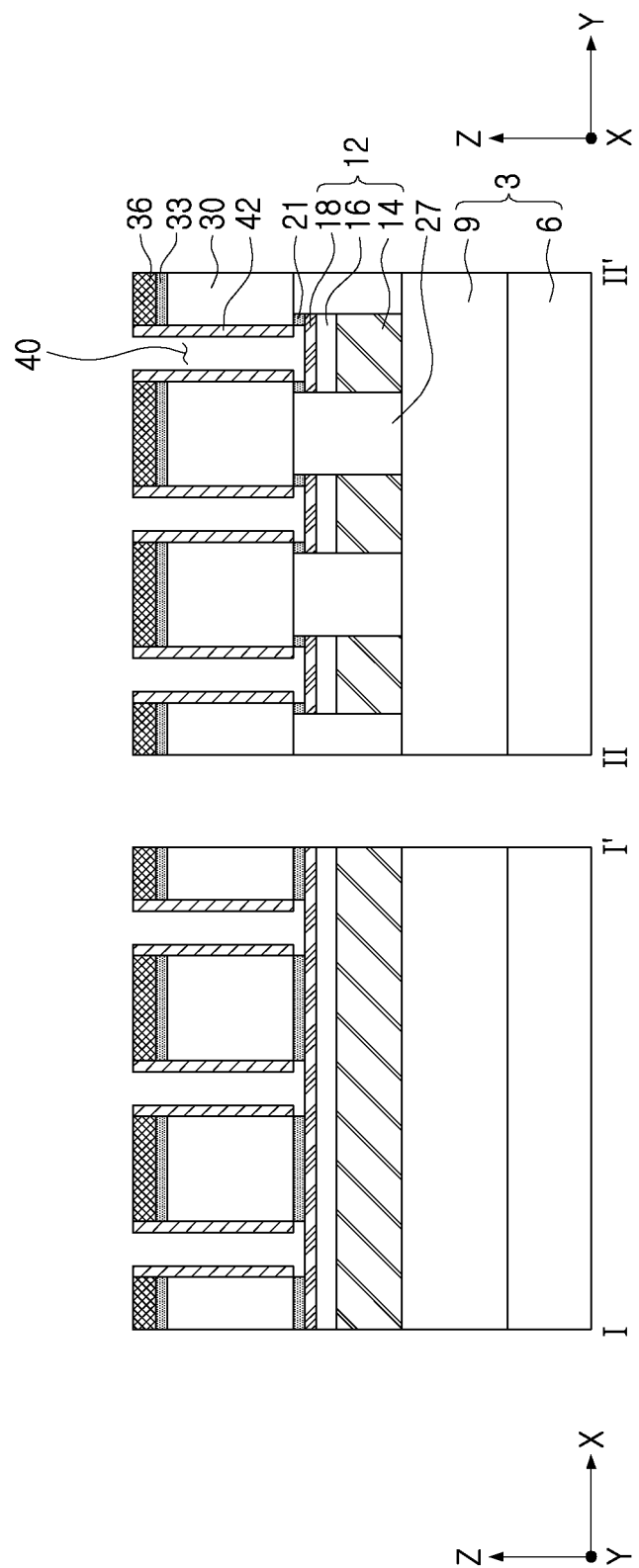

Referring to FIGS. 1 and 18, the buffer layer 21, exposed by the preliminary hole (39 of FIG. 17), may be etched such that a hole 40 may be formed to expose an upper surface of the first conductive structure 12.

In an implementation, at least a portion of the buffer layer 21 that is below the hole spacer 42 may be etched to extend the hole 40 in the first direction X and the second direction Y (e.g., horizontal directions).

Figure 19:
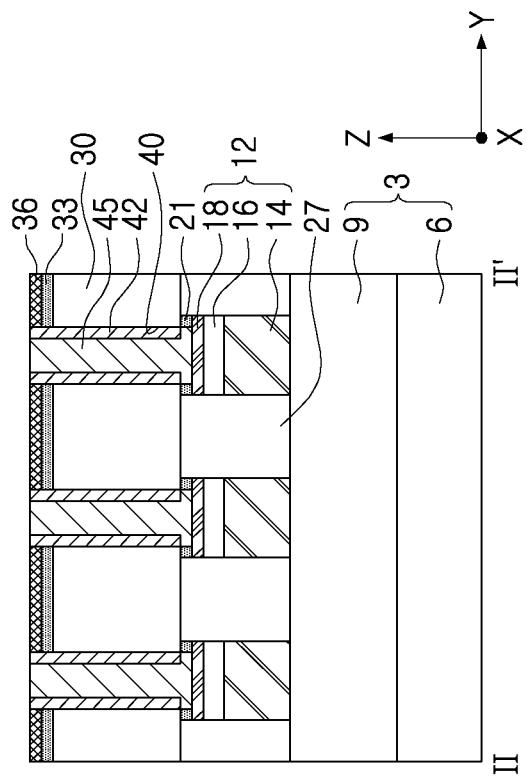
Figure 20:
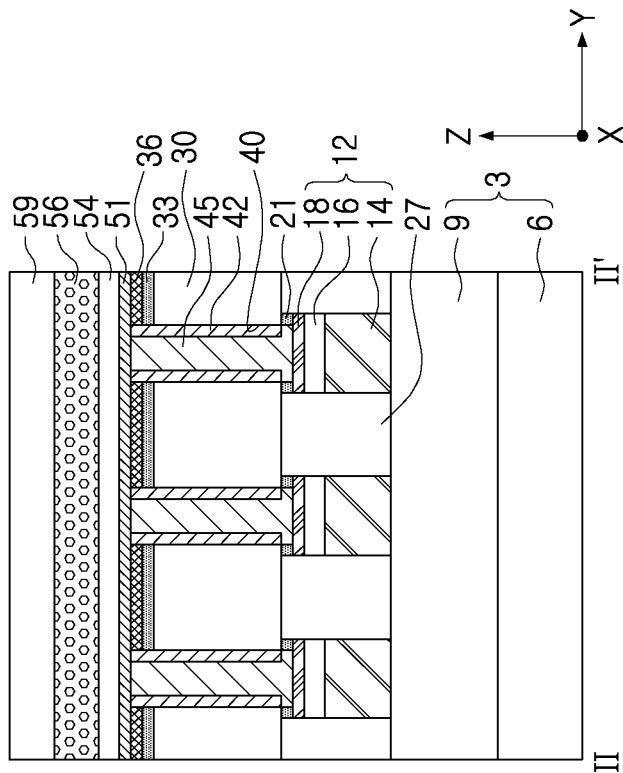
Figure 20:
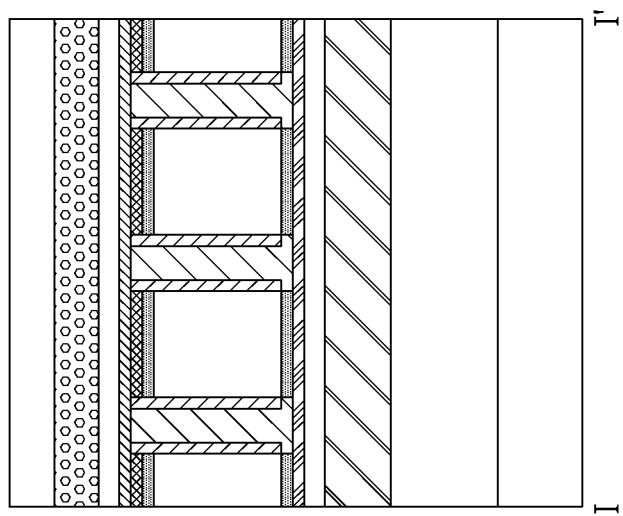

Referring to FIGS. 1 and 19, a data storage material layer may be formed to cover the planarization-stop layer 36 while filling the hole 40, and a planarization process may be performed using the planarization-stop layer 36 as a planarization-stop layer to form a data storage material pattern 45 in the hole 40.

By performing a damascene to form the data storage material pattern 45, an endurance of the data storage material pattern 45 is increased, e.g., by 2 to 3 orders of magnitude.

In an implementation, a thickness of the planarization-stop layer 36 may be decreased during the planarization process In an implementation, the planarization-stop layer 36 may be completely removed to expose the etch-stop layer 33.

In an implementation, after the hole 49 is filled with the data storage material layer, the data storage material layer may be reheated with a laser so that the data storage material layer reflows in the hole 40. Thus, the data storage material pattern 45 may be formed with less defects at a smaller width in the second direction Y, e.g., 14 nm or 12 nm, thereby increasing the scalability of the semiconductor device.

Referring 1 and 20, a plurality of intermediate layers 51 and 54, a switching material layer 56, and a switching upper electrode layer 59, stacked sequentially, may be formed on the planarization-stop layer 36 and the data storage material pattern 45.

Figure 21:
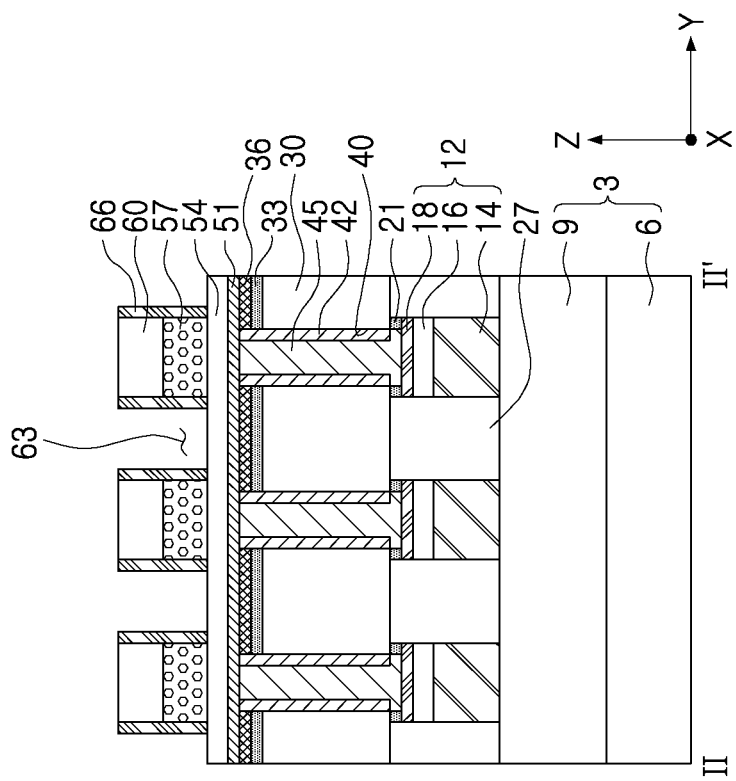
Figure 21:
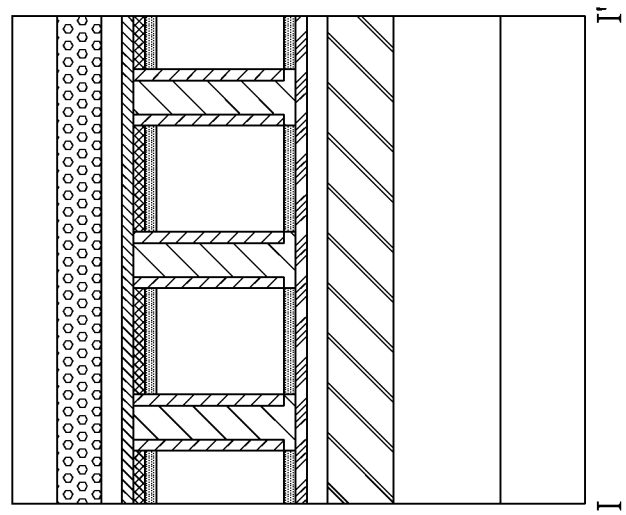

Referring to FIGS. 1 and 21, in the region taken along line the switching material layer 56 and the switching upper electrode layer 59, stacked sequentially, may be patterned to form a first preliminary trench 63. The first preliminary trench 63 may be in the form of a line (e.g., may extend linearly). The first preliminary trench 63 may expose upper surfaces of the plurality of intermediate layers 51 and 54.

While forming the first preliminary trench 63, the switching material layer 56 and the switching upper electrode layer 59 may be etched to be formed as a switching material pattern 57 and a switching upper electrode pattern 60.

A first spacer 66 may be formed on side surfaces of the switching material pattern 57 and the switching upper electrode pattern 60 formed by the first preliminary trench 63. The first spacer 66 may be formed of an insulating material.

Figure 22:
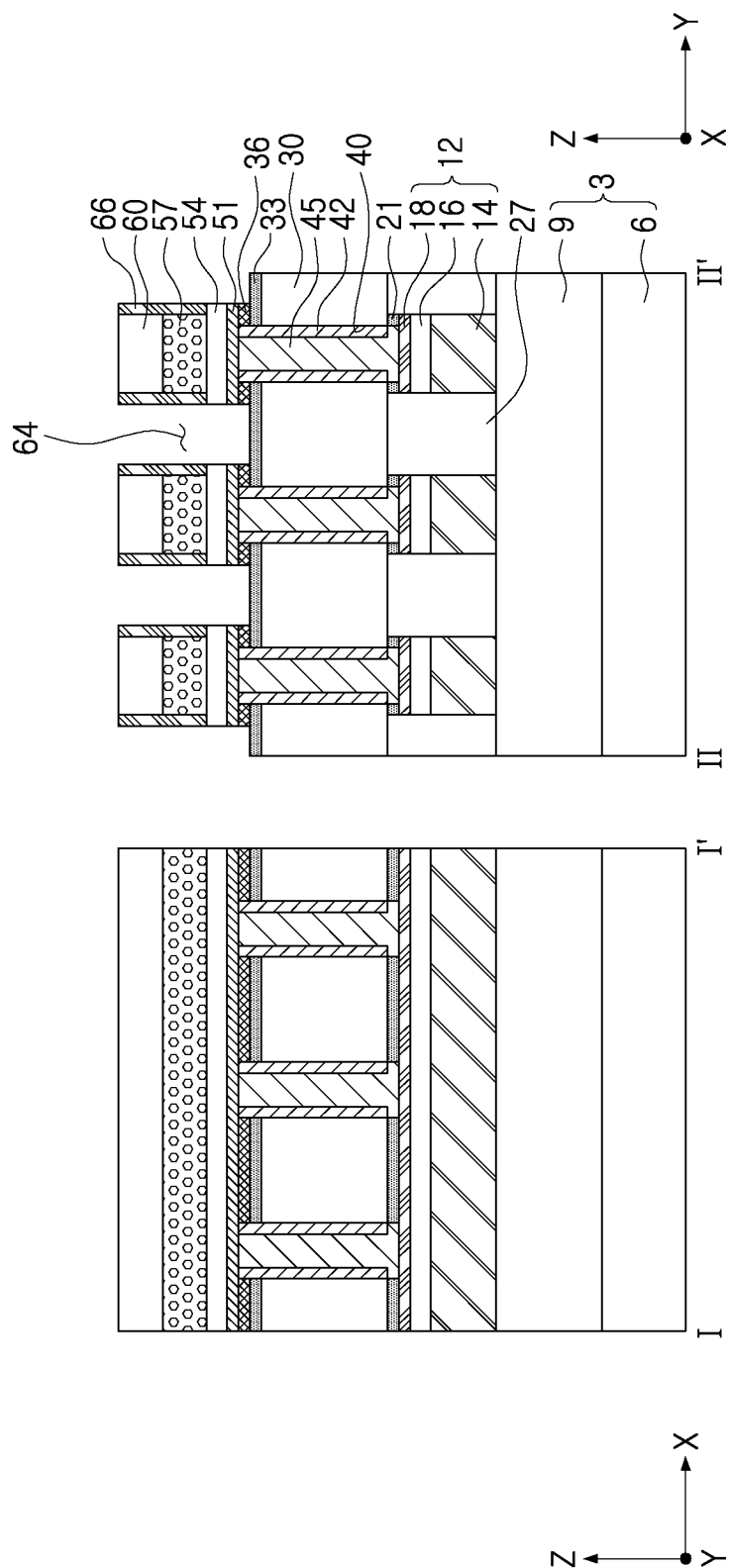

Referring to FIGS. 1 and 22, in the region taken along line the plurality of intermediate layers 51 and 54, exposed by the first preliminary trench 63, may be etched to form a first trench 64.

In an implementation, the first trench 64 may expose the planarization-stop layer 36.

In an implementation, the first trench 64 may expose the etch-stop layer 33 by etching the plurality of intermediate layers 51 and 54 after etching the planarization-stop layer 36.

Figure 23:
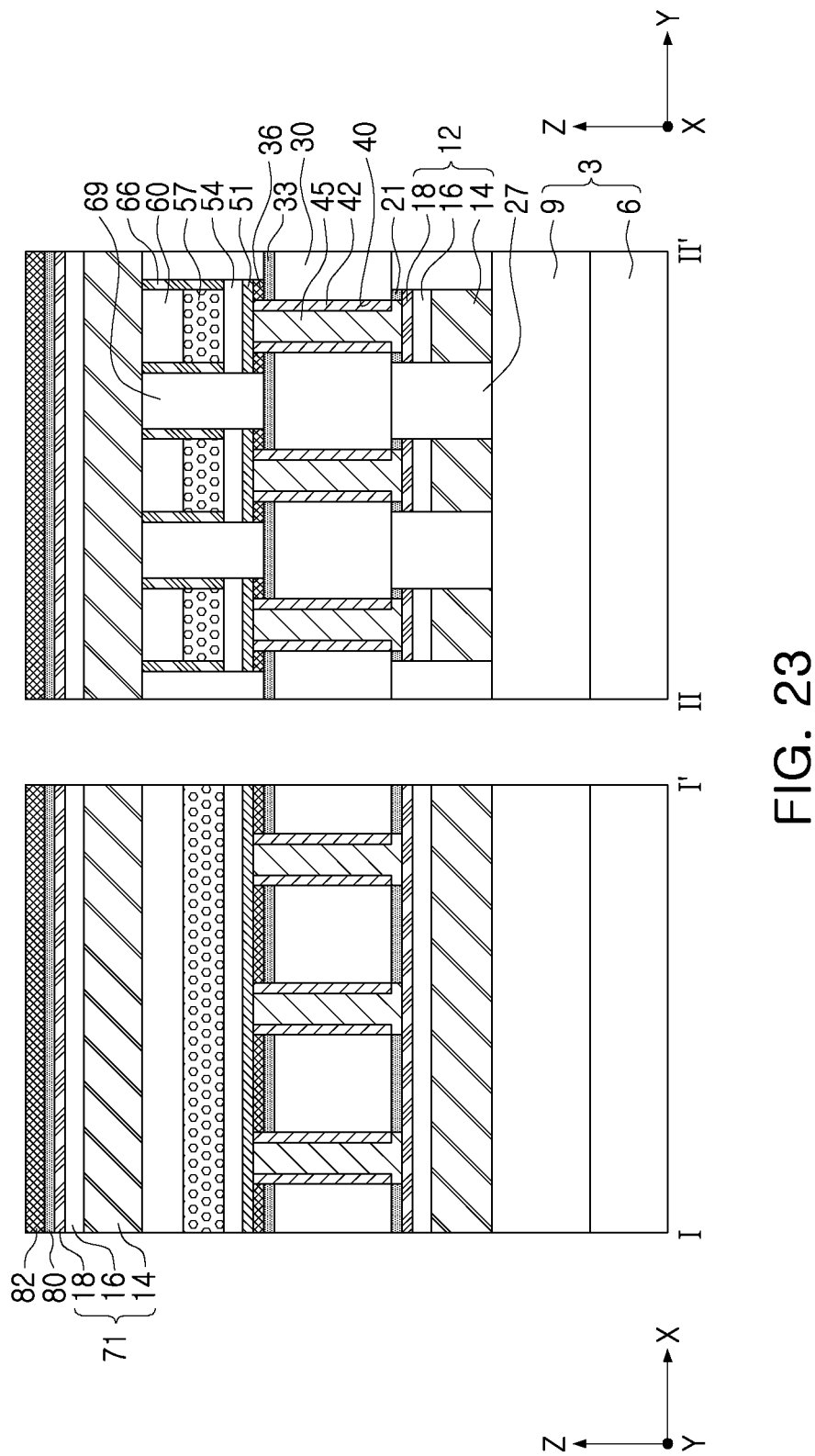

Referring to FIGS. 1 and 23, a gap-fill insulating pattern 69 may be formed to fill the first trench (64 of FIG. 22). An upper conductive layer 71, an upper buffer layer 80, and an upper planarization-stop layer 82, stacked sequentially, may be formed on the gap-fill insulating pattern 69 and the switching upper electrode pattern 60.

In an implementation, the upper conductive layer 71 may include a single layer or a plurality of layers.

In an implementation, when the upper conductive layer 71 is used to form the second conductive structure (72b of FIG. 11A) between the first memory cell structure MC1 and the second memory cell structure MC2 described in FIG. 11A, the upper conductive layer 71 may be formed as a plurality of layers 14, 16, and 18 stacked sequentially. The upper conductive layer 71 may be formed of substantially the same layers as the first conductive structure 12. The upper buffer layer 80 may be substantially the same as the buffer layer (21 of FIG. 14) described with reference to FIG. 14, and the upper planarization-stop layer 82 may be substantially the same as the planarization-stop layer 24 described with reference to FIG. 14.

In an implementation, when the upper conductive layer 71 is used as the third conductive structure 172 of the second memory cell structure (MC2 of FIG. 11A) described in FIG. 11A or as the second conductive structure 72a of the memory cell structure (MC of FIG. 2) descried in FIG. 2, a second lower layer 16 and a third lower layer 18 among the plurality of layers 14, 16, and 18 may be omitted and the upper buffer layer 80 may be omitted.

Figure 24:
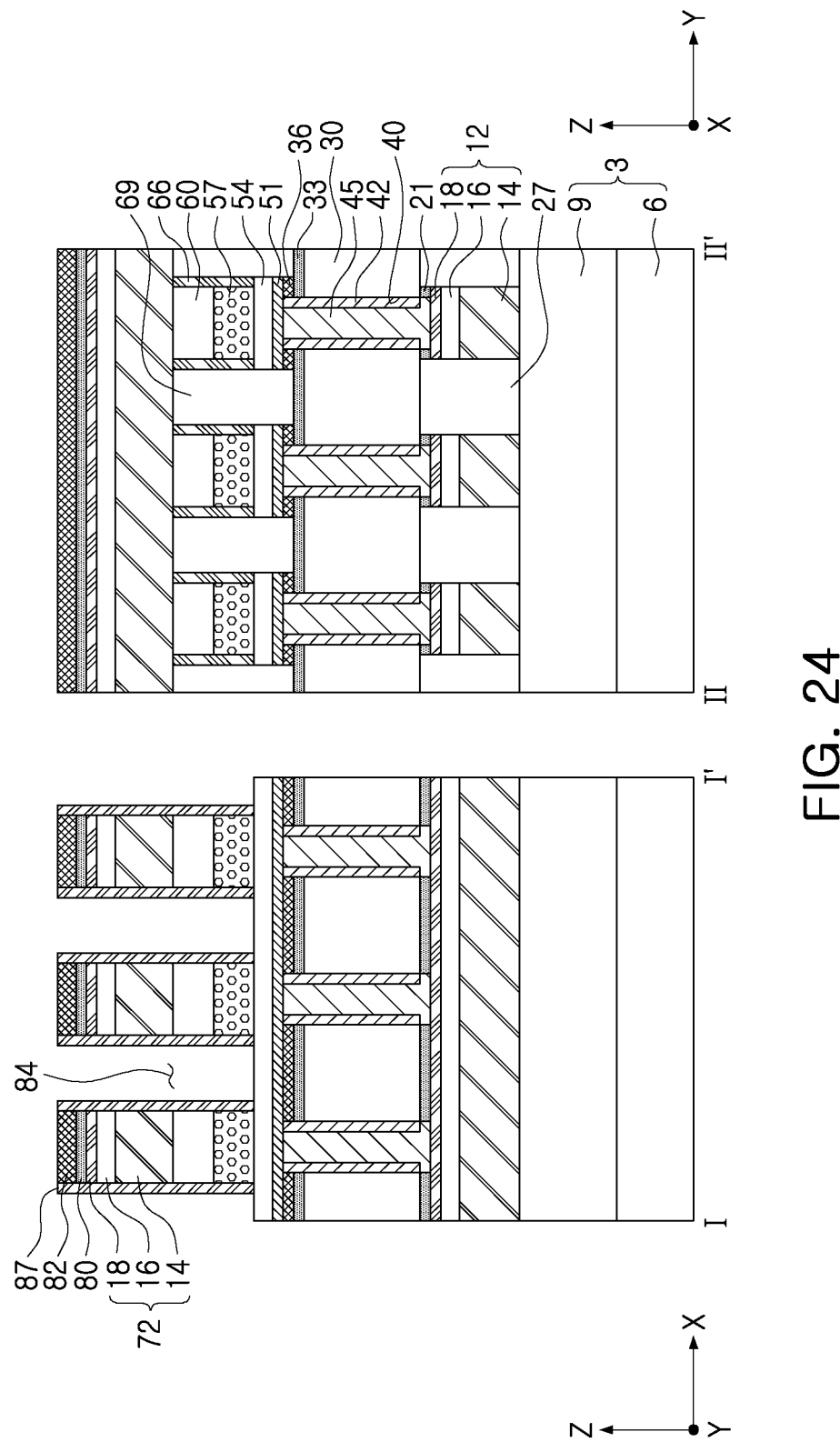

Referring to FIGS. 1 and 24, in the region taken along line I-I', after etching the upper conductive layer (71 of FIG. 23), the upper buffer layer 80, and the upper planarization-stop layer 82 stacked sequentially, the switching upper electrode layer (59 of FIG. 23) and the switching material layer (56 of FIG. 23) may be sequentially etched to form a preliminary trench 84. The preliminary trench 84 may be in the form of a line. While forming the preliminary trench 84, the upper conductive layer (71 of FIG. 23) may be etched to be formed as a second conductive structure 72.

While forming the preliminary trench 84, the switching material layer 56 and the switching upper electrode layer 59 may be etched to be formed as the switching material pattern 57 and the switching upper electrode pattern 60.

A second spacer 87 may be formed to cover a side surface of the switching material pattern 57, a side surface of the switching upper electrode pattern 60, a side surface of the second conductive structure 72, a side surface of the upper buffer layer 80, and a side surface of the upper planarization-stop layer 82, which are exposed by the preliminary trench 84. The second spacer 87 may be formed by heating the second spacer 87 at a temperature greater than or equal to 250 and less than or equal to 350 degrees Celsius, which is lower than a temperature that is conventionally-used. By heating the second spacer 87 at the lower temperature, a performance of the switching material 57 may be increased, and a plurality of semiconductor devices may be stacked on each other as shown in, e.g., FIGS. 11A, 11B and 13.

Figure 25:
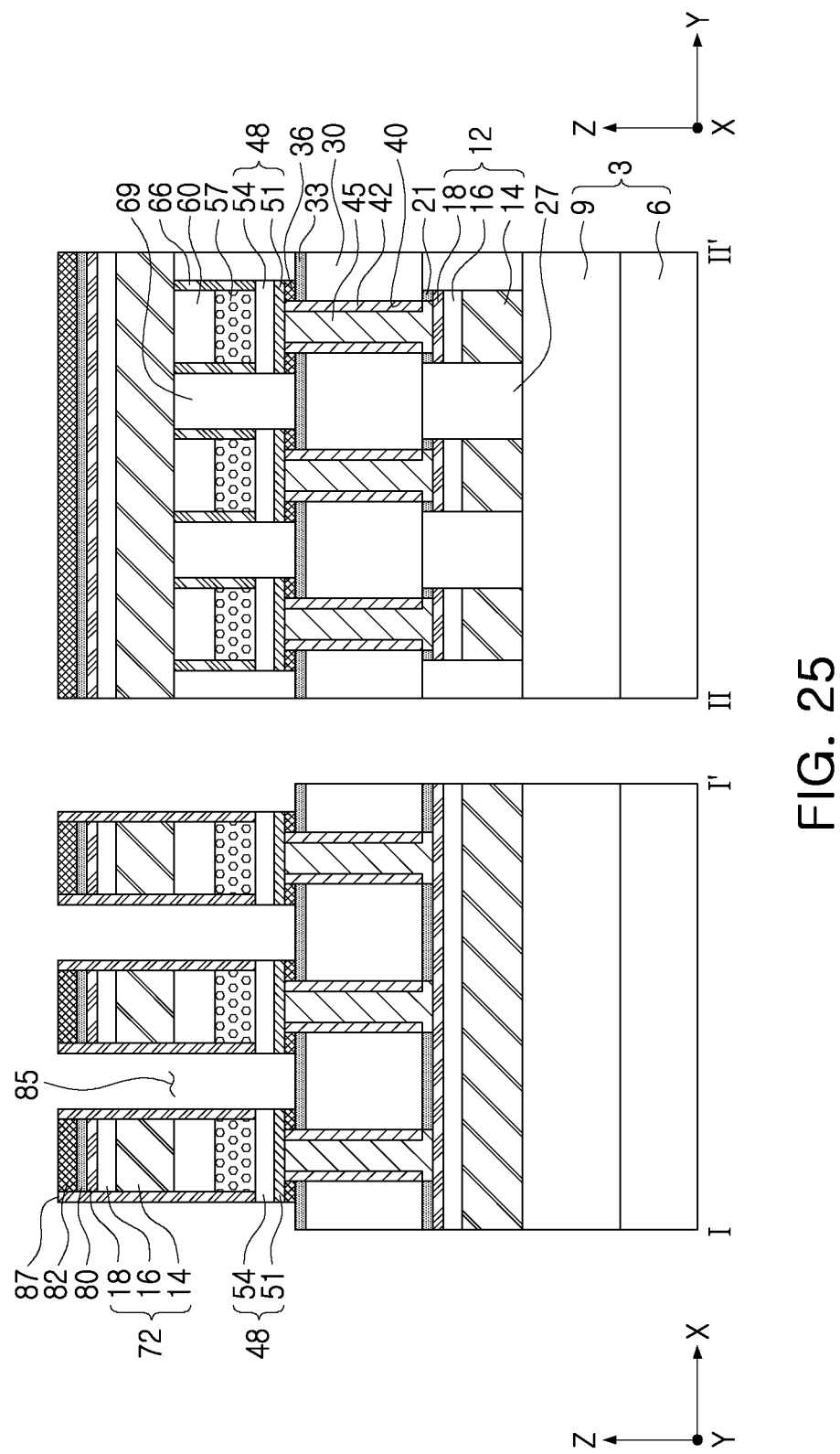

Referring to FIGS. 1 and 25, in the region taken along line I-I', the plurality of intermediate layers 51 and 54 below (e.g., at a bottom of) the preliminary trench (84 of FIG. 24) may be etched to form a second trench 85. The plurality of intermediate layers 51 and 54 may be etched while forming the second trench 85 to be formed as an intermediate conductive pattern 48.

In an implementation, after etching the plurality of intermediate layers 51 and 54 below the preliminary trench (84 in FIG. 24), the second trench 85 may be etched down to the planarization-stop layer 36 to expose the etch-stop layer 33.

The etch-stop layer 33 may help prevent an etching damage to the data storage material pattern 45 that may occur while etching the plurality of intermediate layers 51 and 54.

Returning to FIG. 2 or 11A, a gap-fill material layer may be formed to cover the upper planarization-stop layer (82 of FIG. 25) while filling the second trench (85 of FIG. 25). The gap-fill material layer may be planarized to form a second gap-fill insulating pattern 90. The upper planarization-stop layer (82 of FIG. 25) may be removed.

As described in FIG. 23, when the upper conductive layer (71 of FIG. 23) is used to form the second conductive structure (72b of FIG. 11A) between the first memory cell structure MC1 and the second memory cell structure MC2 described in FIG. 11A, the upper buffer layer (80 FIG. 25) corresponding to the buffer layer (21 in FIG. 14), described in FIG. 14, above the upper conductive layer 71 may be exposed.

As described above in FIG. 23, when the upper conductive layer 71 is used as the third conductive structure 172 of the second memory cell structure (MC2 in FIG. 11A) described in FIG. 11A or as the second conductive structure 72a of the memory cell structure (MC of FIG. 2) described in FIG. 2, a second lower layer 16 and a third lower layer 18 among the plurality of layers 14, 16, and 18 may be omitted and the upper conductive layer (71 of FIG. 23) may be formed of the third conductive structure (172 of FIG. 11A) or the second conductive structure (72a of FIG. 2) of the memory cell structure (MC of FIG. 2) described in FIG. 2.

In an implementation, the data storage material pattern 45 may be formed in a process separately from the first conductive structure 12 (which may serve as a lower electrode of the data storage material pattern 45) and the intermediate conductive pattern 48 (which may serve as a lower electrode of the data storage material pattern 45). A height (e.g., in the vertical direction Z) of the data storage material pattern 45 may be determined by a height of the interlayer insulating layer 30 formed by a deposition process, and a change in height of the data storage material pattern 45 may be significantly reduced to help improve dispersion of the semiconductor device.

Embodiments may provide a semiconductor device including a data storage material pattern.

Embodiments may provide a method of fabricating a semiconductor device including a data storage material pattern.

As described above, according to embodiments, a data storage material pattern, which may have a decreased width, may help reduce operating current of a semiconductor device.

According to embodiments, a data storage material pattern, which may have a constant height, may help improve dispersion of a semiconductor device.

According to embodiments, a data storage material pattern and a first conductive structure may be brought into stable contact with each other. For example, poor contact between the data storage material pattern and the first conductive structure may be prevented to help improve durability and reliability of a semiconductor device.

According to embodiments, a carbon material layer or a material layer including carbon may be above and below a data storage material pattern and may act as a thermal barrier to significantly reduce loss of heat generated in the data storage material pattern during operation of a memory cell structure. As a result, performance of a semiconductor device may be improved.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with an embodiment may be used singly or in combination with features, characteristics, and/or elements described in connection with other embodiments unless otherwise indicated. Accordingly, it will be understood by those of skill in the art that various changes in form and details may be made without departing from the spirit and scope of the inventive concepts as set forth in the following claims.

What is claimed is:

1. A semiconductor device comprising:
a base structure comprising a semiconductor substrate;
a first conductive structure on the base structure, and extending in a first direction, the first conductive structure comprising lower layers, and at least one among the lower layers comprising carbon;
a buffer layer on a first portion of a top surface of the first conductive structure;
an interlayer insulating layer on a top surface of the buffer layer;
a data storage pattern on a second portion of the top surface of the first conductive structure, and penetrating through the interlayer insulating layer and the buffer layer;
an intermediate conductive pattern on the data storage pattern, and comprising intermediate layers, at least one among the intermediate layers comprising carbon;
a switching pattern on the intermediate conductive pattern;
a switching upper electrode pattern on the switching pattern, and comprising carbon;

a second conductive structure on the switching upper electrode pattern, and extending in a second direction intersecting the first direction; and
a hole spacer between the interlayer insulating layer and at least a portion of a side surface of the data storage pattern,
wherein the buffer layer includes a material different from a material of the interlayer insulating layer,
wherein the buffer layer is between a bottom surface of the interlayer insulating layer and the first portion of the top surface of the first conductive structure, and
wherein the buffer layer extending in the first direction parallel to the top surface of the first conductive structure between the first conductive structure and the data storage pattern.

2. The semiconductor device of claim 1, wherein a bottom surface of the hole spacer is higher than a bottom surface of the data storage pattern in which a phase change memory material is included, and
wherein the top surface of the buffer layer is at a lower level than a center between the top surface of the first conductive structure and a top surface of the data storage pattern.

3. The semiconductor device of claim 1, wherein the hole spacer penetrates into the top surface of the buffer layer, and
wherein a bottom surface of the hole spacer is lower than the top surface of the buffer layer.

4. The semiconductor device of claim 1, further comprising a planarization-stop layer interposed between the buffer layer and the interlayer insulating layer,
wherein the hole spacer is interposed between a side surface of the planarization-stop layer and the side surface of the data storage pattern.

5. The semiconductor device of claim 1, further comprising an etch-stop layer on the interlayer insulating layer,
wherein the hole spacer is interposed between a side surface of the etch-stop layer and the side surface of the data storage pattern.

6. The semiconductor device of claim 5, further comprising a planarization-stop layer interposed between the etch-stop layer and the intermediate conductive pattern,
wherein the hole spacer is interposed between a side surface of the planarization-stop layer and the side surface of the data storage pattern.

7. The semiconductor device of claim 6, wherein the data storage pattern extends upwardly, penetrates through the etch-stop layer and the planarization-stop layer, and physically contacts the intermediate conductive pattern.

8. The semiconductor device of claim 1, wherein the data storage pattern, in which a phase change memory material is included, further comprises a portion extending between a bottom surface of the hole spacer and a top surface of the first conductive structure.

9. The semiconductor device of claim 1, wherein the switching upper electrode pattern comprises:
a first upper electrode layer comprising carbon; and
a second upper electrode layer on the first upper electrode layer.

10. The semiconductor device of claim 1, wherein the hole spacer is spaced apart from the first conductive structure.

11. The semiconductor device of claim 1, further comprising gap-fill insulating patterns on the base structure,
wherein the first conductive structure is between the gap-fill insulating patterns, and
wherein the interlayer insulating layer is on the buffer layer and the gap-fill insulating patterns.

12. A semiconductor device comprising:
a base structure comprising a semiconductor substrate;
a first conductive structure on the base structure, and extending in a first direction, the first conductive structure comprising lower layers, and at least one among the lower layers comprising carbon;
a buffer layer contacting a first portion of a top surface of the first conductive structure;
an interlayer insulating layer on a top surface of the buffer layer;
a data storage pattern on a second portion of the top surface of the first conductive structure, and penetrating through the interlayer insulating layer and the buffer layer;
an intermediate conductive pattern on the data storage pattern, and comprising intermediate layers, at least one among the intermediate layers comprising carbon;
a switching pattern on the intermediate conductive pattern;
a switching upper electrode pattern on the switching pattern, and comprising carbon; and
a second conductive structure on the switching upper electrode pattern, and extending in a second direction intersecting the first direction,
wherein a width of the at least one among the intermediate layers comprising carbon is greater than a width of the switching upper electrode pattern
wherein the buffer layer includes a material different from a material of the interlayer insulating layer,
wherein the buffer layer is between a bottom surface of the interlayer insulating layer and the first portion of the top surface of the first conductive structure, and
wherein the buffer layer extending in the first direction parallel to the top surface of the first conductive structure between the first conductive structure and the data storage pattern.

13. The semiconductor device of claim 12, wherein, in the second direction, a width of the at least one among the lower layers comprising carbon is less than the width of the at least one among the intermediate layers comprising carbon, and is less than the width of the switching upper electrode pattern.

14. The semiconductor device of claim 12, further comprising a hole spacer between the interlayer insulating layer and at least a portion of a side surface of the data storage pattern,
wherein a bottom surface of the hole spacer is higher than a bottom surface of the data storage pattern in which a phase change memory material is included, and
wherein the top surface of the buffer layer is at a lower level than a center between the top surface of the first conductive structure and a top surface of the data storage pattern.

15. The semiconductor device of claim 14, wherein the side surface of the data storage pattern is on an entirety of a side surface of the hole spacer.

16. The semiconductor device of claim 14, wherein the data storage pattern, in which a phase change memory material is included, further comprises a portion extending between the bottom surface of the hole spacer and a top surface of the first conductive structure.

17. A semiconductor device comprising:
a base structure comprising a semiconductor substrate;
a first conductive structure on the base structure, and extending in a first direction, the first conductive structure comprising a first lower layer, a second lower layer on the second lower layer, and a third lower layer on the second lower layer;

a buffer layer on a first portion of a top surface of the first conductive structure;

an interlayer insulating layer on a top surface of the buffer layer;

a phase change memory material pattern on a second portion of the top surface of the first conductive structure, and penetrating through the interlayer insulating layer and the buffer layer;

an intermediate conductive pattern on the phase change memory material pattern, and comprising intermediate layers, at least one among the intermediate layers comprising carbon;

a switching pattern on the intermediate conductive pattern;

a switching upper electrode pattern on the switching pattern, and comprising carbon; and a second conductive structure on the switching upper electrode pattern, and extending in a second direction intersecting the first direction, wherein the first lower layer includes a first material, wherein the second lower layer includes a second material different from the first material, wherein the third lower layer includes a third material different from the second material, wherein the second lower layer includes carbon, wherein the buffer layer includes a material different from a material of the interlayer insulating layer, wherein the phase change memory material pattern contacts the third lower layer, wherein the buffer layer is between a bottom surface of the interlayer insulating layer and a top surface of the third lower layer, wherein the buffer layer extending in the first direction parallel to the top surface of the first conductive structure between the first conductive structure and the phase change memory material pattern.

18. The semiconductor device of claim 17, wherein a thickness of the first lower layer is greater than a thickness of the second lower layer, and wherein the thickness of the second lower layer is greater than a thickness of the third lower layer.

19. The semiconductor device of claim 17, further comprising a hole spacer between the interlayer insulating layer and at least a portion of a side surface of the phase change memory material pattern, wherein the hole spacer contacts a first portion of the side surface of the phase change memory material pattern, and wherein the buffer layer contacts a second portion of the side surface of the phase change memory material pattern.

20. The semiconductor device of claim 17, wherein the buffer layer includes at least one of a metal oxide or a metal nitride.

* * * * *